(12) United States Patent
Knapp et al.

(10) Patent No.: US 11,537,045 B2
(45) Date of Patent: Dec. 27, 2022

(54) PHOTOSENSITIVE COMPOSITIONS AND APPLICATIONS THEREOF

(71) Applicant: PROMERUS, LLC, Brecksville, OH (US)

(72) Inventors: Brian Knapp, Brecksville, OH (US); Cheryl Burns, Brecksville, OH (US); Carolyn Scherger, Brecksville, OH (US)

(73) Assignee: PROMERUS, LLC, Akron, OH (US)

( * ) Notice: Subject to any disclaimer, the term of this patent is extended or adjusted under 35 U.S.C. 154(b) by 649 days.

(21) Appl. No.: 16/655,373

(22) Filed: Oct. 17, 2019

(65) Prior Publication Data
US 2021/0116807 A1 Apr. 22, 2021

(51) Int. Cl.
| | | |
|---|---|---|
| *G03C 1/52* | (2006.01) | |
| *G03C 5/18* | (2006.01) | |
| *C08F 2/46* | (2006.01) | |
| *C08F 2/50* | (2006.01) | |
| *C08G 61/04* | (2006.01) | |
| *G03F 7/023* | (2006.01) | |
| *C08K 5/13* | (2006.01) | |
| *C08K 5/5435* | (2006.01) | |
| *C08K 5/18* | (2006.01) | |
| *G03F 7/32* | (2006.01) | |
| *G03F 7/40* | (2006.01) | |
| *C08G 61/02* | (2006.01) | |
| *G03F 7/38* | (2006.01) | |

(52) U.S. Cl.
CPC ............ *G03F 7/023* (2013.01); *C08G 61/02* (2013.01); *C08K 5/13* (2013.01); *C08K 5/18* (2013.01); *C08K 5/5435* (2013.01); *G03F 7/32* (2013.01); *G03F 7/38* (2013.01); *G03F 7/40* (2013.01); *C08G 2261/3324* (2013.01); *C08G 2261/76* (2013.01); *C08G 2261/90* (2013.01)

(58) Field of Classification Search
CPC ...... G03F 7/0233; G03F 7/023; G03F 7/0755; G03F 7/40; G03F 7/38; G03F 7/085; G03F 7/0226; G03F 7/32; C09D 165/00; C09J 165/00; C09L 45/00; C08G 61/08; C08G 61/02; C08G 2261/1424; C08G 2261/122; C08G 2261/1422; C08G 2261/146; C08G 2261/418; C08G 2261/94; C08G 2261/3324; C08G 2261/1426; C08G 2261/76; C08G 2261/63; C08G 2261/90; C08K 5/5435; C08K 5/18; C08K 5/13
USPC .... 430/192, 189, 170, 154, 141; 522/6, 189, 522/184, 71, 1; 520/1
See application file for complete search history.

(56) References Cited

U.S. PATENT DOCUMENTS

| 9,696,623 B2 | 7/2017 | Knapp et al. | |
|---|---|---|---|
| 2016/0223908 A1* | 8/2016 | Knapp | C09J 163/00 |

FOREIGN PATENT DOCUMENTS

| JP | 2014225662 | * | 4/2014 | | |
|---|---|---|---|---|---|
| JP | 2014224255 | * | 12/2014 | | |
| JP | 2016086073 | * | 5/2016 | | |
| WO | WO 2016-063908 A1 | | 4/2016 | | |
| WO | WO 2016-063909 A1 | | 4/2016 | | |
| WO | WO-2016063908 A1 | * | 4/2016 | ............ | C09J 145/00 |
| WO | WO-2016063909 A1 | * | 4/2016 | .............. | C09J 11/06 |

OTHER PUBLICATIONS

Sugiyama et al, JP 2014-225662 Machine Translation, Apr. 12, 2014 (Year: 2014).*
Sugiyama et al, JP 2014224255 Machine Translation, Dec. 4, 2014 (Year: 2014).*
Fujita et al, WO 2016063908 Machine Translation, Apr. 28, 2016 (Year: 2016).*
Gajeumi et al, WO 2016063909 Machine Translation, Apr. 28, 2016 (Year: 2016).*
Horii et al, JP 2016-086073 Machine Translation, May 19, 2016 (Year: 2016).*
Written Opinion of PCT/US2019/056647, dated Apr. 22, 2021; Also see WO 2021/076131 A1, Apr. 22, 2021.

* cited by examiner

*Primary Examiner* — Jessica Whiteley
(74) *Attorney, Agent, or Firm* — Balaram Gupta

(57) ABSTRACT

The present invention relates to photosensitive compositions containing polynorbornene (PNB) polymers and certain additives that are useful for forming microelectronic and/or optoelectronic devices and assemblies thereof, and more specifically to compositions encompassing PNBs and certain multifunctional crosslinking agents, and two or more phenolic compounds which are resistant to thermo-oxidative chain degradation and exhibit improved mechanical properties.

20 Claims, 2 Drawing Sheets

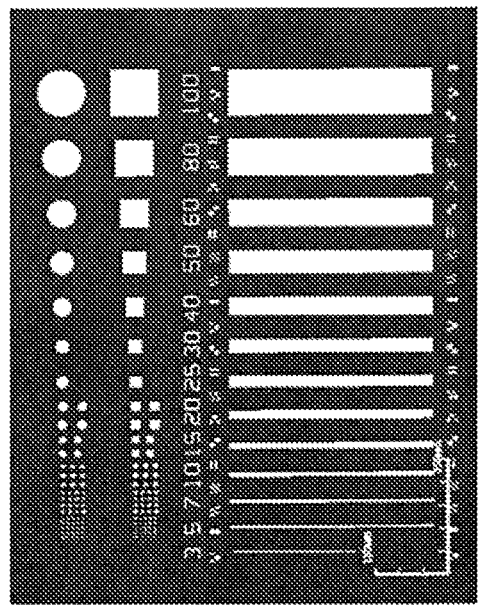
FIG. 1A
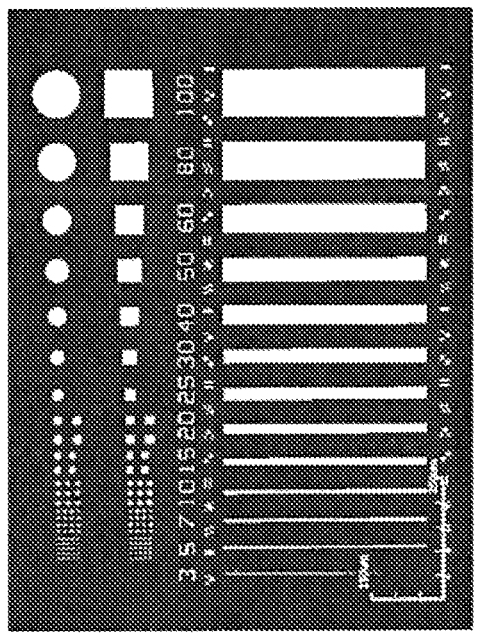
FIG. 1B
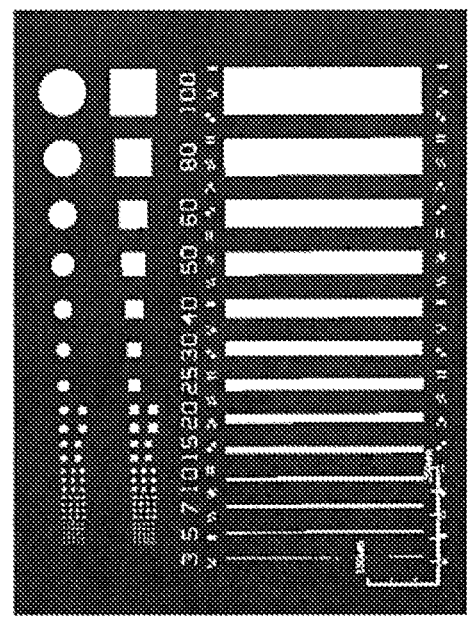
FIG. 1C
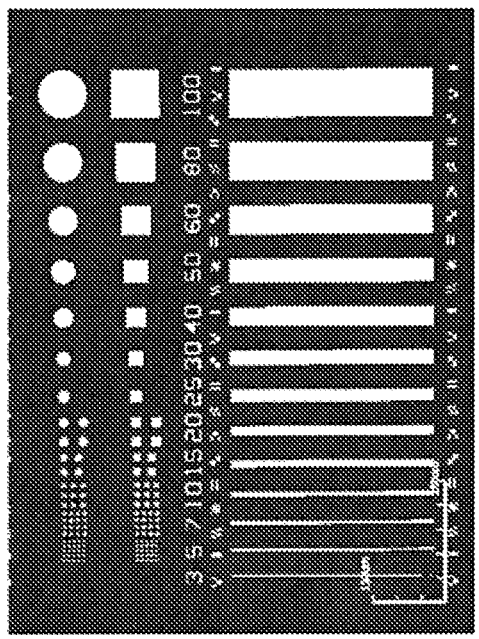
FIG. 1D
FIG. 1

PHOTOSENSITIVE COMPOSITIONS AND APPLICATIONS THEREOF

TECHNICAL FIELD

Embodiments in accordance with the present invention relate generally to polynorbornene (PNB) compositions, which contain a wide variety of additives that are useful for forming microelectronic and/or optoelectronic devices and assemblies thereof, and more specifically to compositions encompassing PNBs with at least one of norbornene-type repeating unit which contains a polyether functionalized end group, where such compositions exhibit improved thermal, mechanical and opto-electronic properties.

BACKGROUND

Organic polymer materials are increasingly being used in the microelectronics and optoelectronics industries for a variety of applications. For example, the uses for such organic polymer materials include interlevel dielectrics, redistribution layers, stress buffer layers, leveling or planarization layers, alpha-particle barriers, and passivation layers for microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS) and microoptoelectromechanical systems (MOEMS).

While polyimide (PI), polybenzoxazole (PBO) and benzocyclobutane (BCB) compositions have been materials of choice for many of the aforementioned applications due to their generally good thermal stability and mechanical strength, each of the above materials are either formed during curing from precursors that react to modify the polymer's backbone (PI and PBO) or to form such backbone (BCB) and thus generally require special handling conditions during curing to remove by-products that are formed during such curing and/or to exclude oxygen or water vapor that can prevent such curing. Additionally, the curing of such materials often requires process temperatures in excess of 250° C. (and as high as 400° C. for some materials), resulting in excessive and undesirable process costs. Therefore such materials can be problematic for some applications, e.g., redistribution and interlevel dielectric layers as well as direct adhesive bonding of a transparent cover over image sensing arrays.

Therefore it is believed that it would be advantageous to provide a material, useful for forming the aforementioned structures, that exhibits thermal stability and mechanical strength equivalent to the known PI, PBO, and BCB compositions, where such a material has a fully formed polymer backbone that allows for curing at temperatures of 200° C. or lower. Further, such an advantageous material should be tailorable in its characteristics to provide appropriate levels or values of stress, modulus, dielectric constant, elongation to break and permeability to water vapor for the application for which it is intended. Still further, it would be advantageous for such a material to be self-imageable. In addition, several of the presently available compositions may not be suitable in certain of the applications as they do not exhibit the required dissolution rate (DR) properties, including desirable resolution and photospeed, as further described in detail below.

A few of the above mentioned problems have been successfully overcome by the polynorbornene based photosensitive compositions disclosed in U.S. Pat. Nos. 9,341,949 and 9,696,623, however, there still remains a need for suitable flexible materials that provides much needed adhesive strength and mechanical strength, particularly, die shear strength for fabricating a variety of micro-optoelectronic devices, such as display devices, among others.

Accordingly, there is still a need to develop self imageable photosensitive polymer compositions which feature desirable thermal properties, dissolution rate, orthogonality to various solvents used in different steps of the device fabrication processes, bond adhesion, and most importantly integration into all involved process steps.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

FIG. 1 shows photolithographic images formed from a composition of this invention at various exposure doses, represented as FIGS. 1A to 1D.

DETAILED DESCRIPTION

Figure 2:
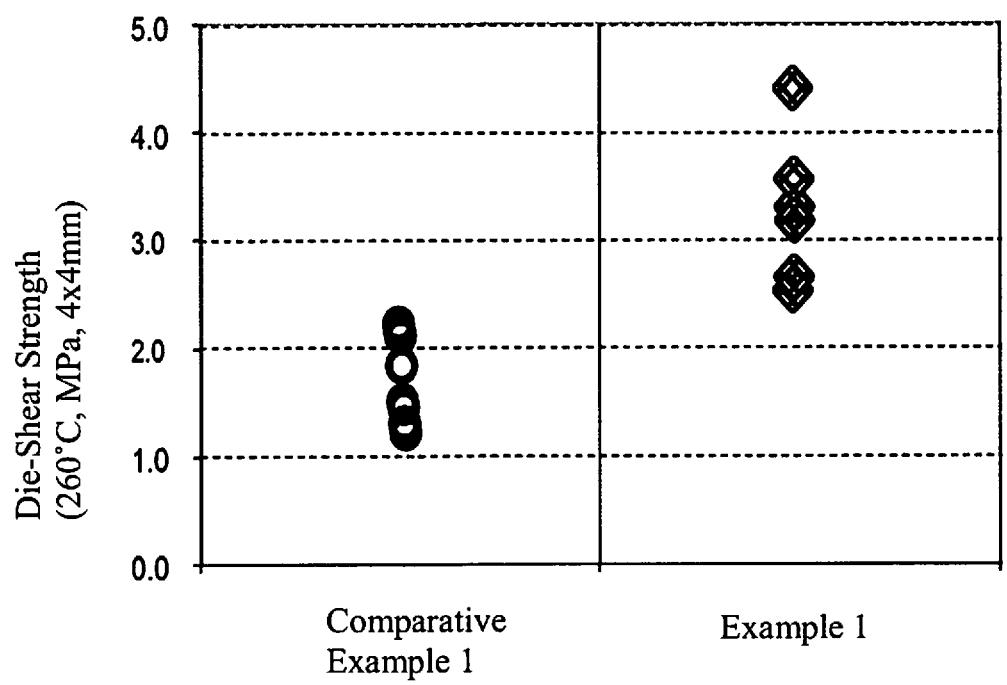
FIG. 2 shows die shear strength of a composition of this invention which is compared with a comparative composition.

Embodiments in accordance with the present invention are directed to self-imageable compositions that encompass norbornene-type polymers and the films, layers, structures, devices or assemblies that can be formed using such compositions. Some of such embodiments encompass self-imageable compositions which can provide positive-tone images, after image-wise exposure of a film formed thereof, followed by development of such images, using an aqueous base developer solution.

Further, the embodiments as described fully herein can routinely provide films of desirable thickness in the range of about 2 to 5 microns (μm) or greater and images demonstrating aspect ratios in excess of 1:2 for isolated line/trench resolution in such films. The films, layers, and structures formed from the polymer embodiments of the present invention being useful for, among other things, interlevel dielectrics, redistribution layers, stress buffer layers, leveling or planarization layers, alpha-particle barriers for both microelectronic and optoelectronic devices and the assemblies formed thereof, as well as adhesive bonding to form chip-stacks and to fixably attach transparent covers over image sensing arrays.

The terms as used herein have the following meanings:

Unless otherwise indicated, all numbers, values and/or expressions referring to quantities of ingredients, reaction conditions, polymer compositions, and formulations used herein are to be understood as modified in all instances by the term "about" as such numbers are inherently approximations that are reflective of, among other things, the various uncertainties of measurement encountered in obtaining such values. Further, where a numerical range is disclosed herein, such range is continuous, and includes unless otherwise indicated, every value from the minimum value to and including the maximum value of such range. Still further, where such a range refers to integers, unless otherwise indicated, every integer from the minimum value to and including the maximum value is included. In addition, where multiple ranges are provided to describe a feature or characteristic, such ranges can be combined to further describe such a feature or characteristic.

As used herein, the articles "a," "an," and "the" include plural referents unless otherwise expressly and unequivocally limited to one referent.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof. Similarly, microelectromechanical systems (MEMS) include microoptoelectro-mechanical systems (MOEMS).

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the term "polymer" will be understood to mean a molecule that encompasses a backbone of one or more distinct types of repeating units (the smallest constitutional unit of the polymer) and is inclusive of, in addition to the polymer itself, residues from initiators, catalysts, and other elements attendant to the forming of such a polymer, where such residues are generally understood as not being covalently incorporated thereto, but maybe covalently bound to the front or back end of the polymeric chain as in certain catalyst initiated polymerization. Further, such residues and other elements, while normally removed during post polymerization purification processes, are typically mixed or co-mingled with the polymer such that some small amount generally remains with the polymer when it is transferred between vessels or between solvents or dispersion media.

As used herein, the term "polymer composition" is meant to include at least one synthesized polymer, as well as materials added after the forming of the polymer(s) to provide or modify specific properties of such composition. Exemplary materials that can be added include, but are not limited to, solvents, photoactive compounds (PAC), dissolution rate inhibitors, dissolution rate enhancers, dissolution promoters, crosslinking moieties, reactive diluents, antioxidants, adhesion promoters, and plasticizers.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

As used herein, "hydrocarbyl" refers to a radical or a group that contains only carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen atom has been replaced by a halogen atom. The term perhalocarbyl refers to a hydrocarbyl group where all hydrogens have been replaced by halogens. The term "heterohydrocarbyl" refers to any of the previously described hydrocarbyls, halohydrocarbyls, and perhalohydrocarbyls where at least one carbon atom of the carbon chain is replaced with an N, O, S, Si or P atom.

As used herein, the symbol "  " denotes a position at which the bonding takes place with another repeat unit or another atom or molecule or group or moiety as appropriate with the structure of the group as shown.

As used herein, the expression "alkyl" means a saturated, straight-chain or branched-chain hydrocarbon substituent having the specified number of carbon atoms. Particular alkyl groups are methyl, ethyl, n-propyl, isopropyl, tert-butyl, and so on. Derived expressions such as "alkoxy", "thioalkyl", "alkoxyalkyl", "hydroxyalkyl", "alkylcarbonyl", "alkoxycarbonylalkyl", "alkoxycarbonyl", "diphenylalkyl", "phenylalkyl", "phenylcarboxyalkyl" and "phenoxyalkyl" are to be construed accordingly.

As used herein, the expression "cycloalkyl" includes all of the known cyclic aliphatic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "alkenyl" means a non-cyclic, straight or branched hydrocarbon chain having the specified number of carbon atoms and containing at least one carbon-carbon double bond, and includes ethenyl and straight-chained or branched propenyl, butenyl, pentenyl and hexenyl groups. Similarly, the expression "alkynyl" means a non-cyclic, straight or branched hydrocarbon chain having the specified number of carbon atoms and containing at least one carbon-carbon triple bond, and includes ethynyl and propynyl, and straight-chained or branched butynyl, pentynyl and hexynyl groups.

As used herein the expression "acyl" shall have the same meaning as "alkanoyl", which can also be represented structurally as "R—CO—," where R is an "alkyl" as defined herein having the specified number of carbon atoms. Additionally, "alkylcarbonyl" shall mean same as acyl as defined herein. Specifically, "$(C_1$-$C_4)$acyl" shall mean formyl, acetyl or ethanoyl, propanoyl, n-butanoyl, etc. Derived expressions such as "acyloxy" and "acyloxyalkyl" are to be construed accordingly.

As used herein, the expression "perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "perfluoroalkoxy", is to be construed accordingly.

As used herein, the expression "aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "arylsulfonyl," is to be construed accordingly.

The expressions "arylalkyl" or "aralkyl" are used interchangeably herein, and specifically "($C_6$-$C_{10}$)aryl($C_1$-$C_4$) alkyl" or "($C_7$-$C_{14}$)aralkyl" means that the ($C_6$-$C_{10}$)aryl as defined herein is further attached to ($C_1$-$C_4$)alkyl as defined herein. Representative examples include benzyl, phenylethyl, 2-phenylpropyl, 1-naphthylmethyl, 2-naphthylmethyl, and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of ($C_1$-$C_6$)alkyl, ($C_2$-$C_6$)alkenyl, ($C_1$-$C_6$)perfluoroalkyl, phenyl, hydroxy, —$CO_2H$, an ester, an amide, ($C_1$-$C_6$) alkoxy, ($C_1$-$C_6$)thioalkyl, ($C_1$-$C_6$)perfluoroalkoxy, —$NH_2$, $C_1$, Br, I, F, —NH-lower alkyl, and —N(lower alkyl)$_2$. However, any of the other suitable substituents known to one skilled in the art can also be used in these embodiments.

As used herein, the term Organic Field Effect Transistors (OFET) will be understood to be inclusive of the subclass of such devices known as Organic Thin Film Transistors (OTFTs).

It will be understood that the terms "dielectric" and "insulating" are used interchangeably herein. Thus reference to an insulating material or layer is inclusive of a dielectric material or layer and vice versa. Further, as used herein, the term "organic electronic device" will be understood to be inclusive of the term "organic semiconductor device" and the several specific implementations of such devices such as the organic field effect transistors (OFETs).

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve or swell said previously deposited layer.

As used herein, the terms "polycycloolefin", "poly(cyclic) olefin", and "polynorbornene-type" are interchangeably used to refer to polymers formed from addition polymerizable monomers, the repeating units in the resulting polymers or the compositions that encompass such polymers, where repeating units of such resulting polymers encompass at least one norbornene-type moiety. The simplest norbornene-type polymerizable monomer encompassed by embodiments in accordance with the present invention is norbornene itself, bicyclo[2.2.1]hept-2-ene, as shown below:

However, the term norbornene-type monomer, norbornene-type repeating unit or norbornene-type polymer (PNB) as used herein is not limited to such moieties that encompass only norbornene itself, but rather to any substituted norbornene(s), or substituted and unsubstituted higher cyclic derivatives thereof.

It has now been found that certain of the additives when used in conjunction with the composition of this invention remarkably improves the performance of the compositions in forming a thick or thin film having utility in a variety of applications including but not limited to mechanical, electrical, or electromechanical devices, including chip-stacking applications, as a redistribution layer (RDL) and in dam structures of a complementary metal oxide semiconductor (CMOS) image sensor and various other MEMS and MOEMS containing devices.

Thus, in accordance with the practice of this invention there is provided a photosensitive composition comprising:

a) a polymer having a first type of repeating unit of formula (IA) derived from a monomer of formula (I):

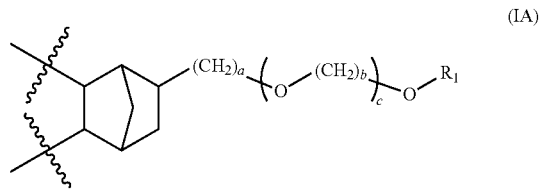

(IA)

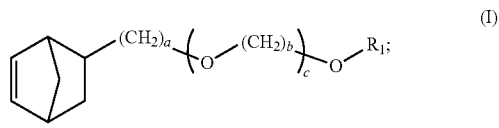

(I)

a second type of repeating unit of formula (IIA) derived from a monomer of formula (II):

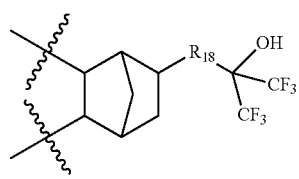
(IIA)

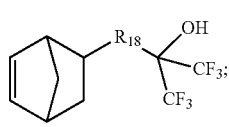
(II)

and a third type of repeating unit of formula (IIIA) derived from a monomer of formula (III):

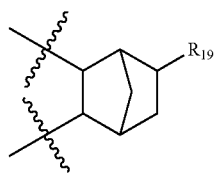
(IIIA)

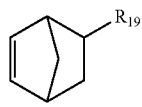
(III)

wherein:
~~~ represents a position at which the bonding takes place with another repeat unit;
a is an integer from 0 to 3 inclusive;
b is an integer from 1 to 4 inclusive;
c is an integer from 1 to 4 inclusive;
$R_1$ is selected from the group consisting of hydrogen, methyl, ethyl, n-propyl, i-propyl and n-butyl, wherein one or more of the methylene group, i.e., $CH_2$ group may optionally be substituted independently with a group selected from the group consisting of ($C_1$-$C_4$)alkyl, phenyl and phenyl($C_1$-$C_4$)alkyl;
$R_{18}$ is selected from —$(CH_2)_s$—, —$(CH_2)_t$—$OCH_2$— or —$(CH_2)_t$—$(OCH_2CH_2)_u$—$OCH_2$—, where
s is an integer from 0 to 6,
t is an integer from 0 to 4;
u is an integer from 0 to 3;
$R_{19}$ is —$(CH_2)_v$—$CO_2R_{20}$ where v is an integer from 0 to 4, and
$R_{20}$ is hydrogen or $C_1$-$C_4$alkyl;
b) a photo active compound containing a diazo-quinone moiety of formula (A):

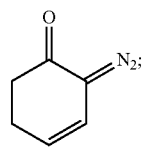
(A)

c) a multifunctional crosslinking agent selected from the group consisting of:
a compound of the formula (IV):

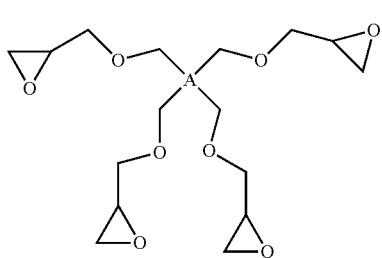
(IV)

and a compound of the formula (V):

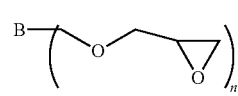
(V)

wherein:
n is an integer from 5 to 8;
A is selected from the group consisting of C, CH—$(CR_2)_d$—CH and substituted or unsubstituted aryl, where d is an integer from 0 to 4 and R is selected from the group consisting of hydrogen, methyl, ethyl, n-propyl, i-propyl and n-butyl;
B is selected from the group consisting of substituted or unsubstituted ($C_2$-$C_6$)alkylene and substituted or unsubstituted aryl;
wherein said substituents are selected from the group consisting of halogen, methyl, ethyl, linear or branched ($C_3$-$C_6$)alkyl, ($C_3$-$C_8$)cycloalkyl, ($C_6$-$C_{10}$) aryl, ($C_7$-$C_{12}$)aralkyl, methoxy, ethoxy, linear or branched ($C_3$-$C_6$)alkyloxy, ($C_3$-$C_8$)cycloalkyloxy, ($C_6$-$C_{10}$)aryloxy and ($C_7$-$C_{12}$)aralkyloxy;

d) a phenolic compound selected from the group consisting of:

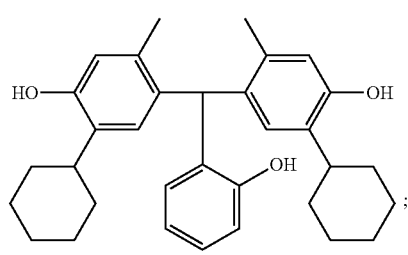
a-1

-continued

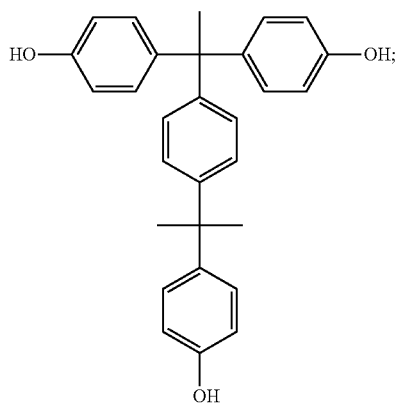
a-2

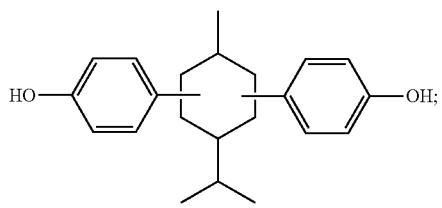
a-3

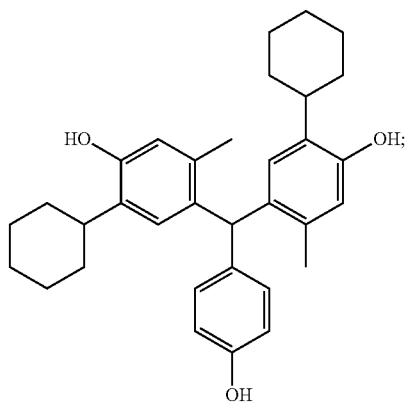
a-4

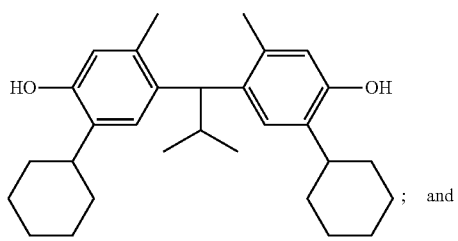
a-5

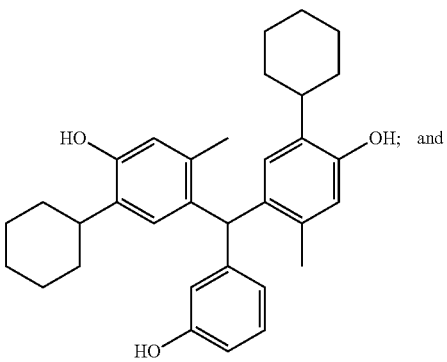
a-6 e) a compound of formula (VI):

$$\text{(VI)}$$

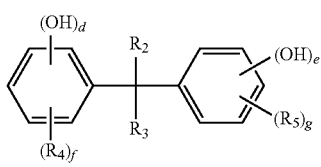

wherein d and e are integers from 1 to 4;

f and g are integers from 0 to 4;

$R_2$ and $R_3$ are the same or different and independently of each other selected from hydrogen, methyl, ethyl, linear or branched $C_3$-$C_6$alkyl, $C_3$-$C_8$cycloalkyl, $C_6$-$C_{10}$aryl and $C_7$-$C_{12}$aralkyl; or $R_2$ and $R_3$ taken together with the carbon atom to which they are attached form a 5 to 8 membered substituted or unsubstituted carbocyclic ring where said substituents are selected from $C_1$-$C_8$alkyl;

$R_4$ and $R_5$ are the same or different and independently of each other selected from hydrogen, methyl, ethyl, linear or branched $(C_3$-$C_6)$alkyl, $(C_3$-$C_8)$cycloalkyl, $(C_6$-$C_{10})$aryl and $(C_7$-$C_{12})$aralkyl.

In some embodiments, the polymer of this invention contains a repeat unit of formula (IIIA), in which $R_{20}$ is generally hydrogen. However, some embodiments may contain a polymer having a mixture of repeat units of formula (MA) in which portions of the repeat units of formula (IIIA) have $R_{20}$ as hydrogen and other portions of repeat units of formula (IIIA) have $R_{20}$ as $(C_1$-$C_4)$alkyl. Accordingly, it should be understood that all such variations are part of this invention as readily appreciated by one of skill in the art.

Non-limiting examples of monomers that can be employed to form the first repeat unit of the polymer of this invention include the following:

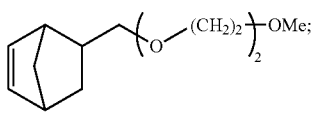

5-((2-(2-methoxyethoxy)ethoxy)methyl)
bicyclo[2.2.1]hept-2-ene, also referred
to as trioxanonanenorbornene (NBTON)

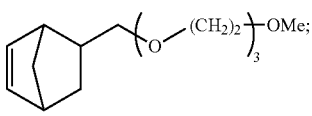

1-(bicyclo[2.2.1]hept-5-en-2-yl)-2,5,8,11-
tetraoxadodecane, also referred to as
tetraoxadodecanenorbornene (NBTODD)

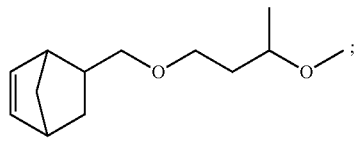

5-(3-methoxybutoxy)methyl-2-norbornene
(NB-3-MBM)

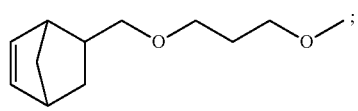

5-(3-methoxypropanoxy)methyl-2-norbornene
(NB-3-MPM)

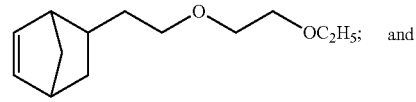  and 5-(2(2-ethoxyethoxy)ethyl)bicyclo[2.2.1]hept-2-ene

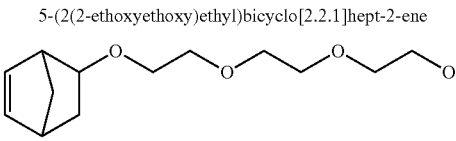

5-(2-(2-(2-propoxyethoxy)ethoxy)ethoxy)bicyclo[2.2.1]hept-2-ene

Non-limiting examples of monomers that can be employed to form the second repeat unit of the polymer of this invention include the following:

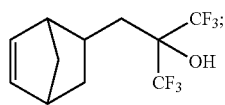

norbornenyl-2-trifluoromethyl-3,3,3-
trifluoropropan-2-ol(HFANB)

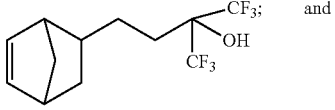  and 4-(bicyclo[2.2.1]hept-5-en-2-yl)-1,1,1-
trifluoro-2-(trifluoromethyl)
butan-2-ol(HFACH$_2$NB)

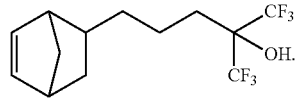

5-(bicyclo[2.2.1]hept-5-en-2-yl)-1,1,1-
trifluoro-2-(trifluoromethyl)pentan-
2-ol(HFACH$_2$CH$_2$NB)

Non-limiting examples of monomers that can be employed to form the second repeat unit of the polymer of this invention include the following:

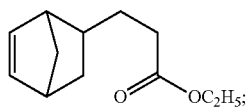

ethyl 3-(bicyclo[2.2.1]hept-2-
en-2-yl)propanoate (EPEsNB)

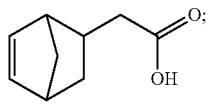

3-(bicyclo[2.2.1]hept-5-en-
2-yl)acetic acid (NBMeCOOH)

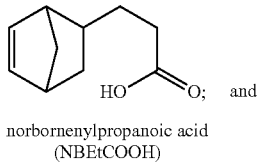  and norbornenylpropanoic acid
(NBEtCOOH)

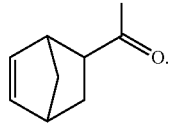

bicyclo[2.2.1]hept-5-
ene-2-carboxylic acid
(Acid NB)

It should however be noted that the photosensitive composition of this invention can be made by employing a polymer derived from any three monomers listed above, which are within the scope of the monomers of formulae (I) to (III). Further any amounts of the monomers of formulae (I) to (III) can be employed to form the polymer which produces the intended benefit and for the intended purpose as further described below. Accordingly, all such conceivable monomer ratios are part of this invention.

In some embodiments of this invention the photosensitive composition of this invention is made by using a terpolymer containing any of three monomers as described herein.

In general, the polymer embodiments in accordance with the present invention encompass the above described one or more of the first, second and third distinct type of repeating units, as it will be seen below, other repeating units encompassed by such polymer embodiments are selected to provide properties to such polymer embodiments that are appropriate and desirable for the use for which such embodiments are directed, thus such polymer embodiments are tailorable to a variety of specific applications.

For example, polymer embodiments generally require at least one repeating unit directed to providing imageability. Thus distinct types of repeating units, represented by structural formula (IIIA), can include $R_{19}$ being a carboxylic acid containing pendent group. However, any of the other functional group which would result in an acidic pendent moiety can also be used instead. Carboxylic acid pendent groups are generally useful for participating in a reaction with appropriately selected additives, or other repeating units that can lead to fix a positive-tone image via post develop thermal crosslinking. Thus, similar pendent groups including but not limited to phenolic, sulfonic and other functional groups may also work in this embodiment of the invention. It should further be noted that one of skill in the art readily appreciates that such polymer compositions containing acidic pendent groups can be made post polymerization by utilizing appropriate monomers. For example, a polymer containing NBEt-COOH monomer repeat units can generally be made by first forming the polymer using EPEsNB, and then hydrolyzing the ester function in the resulting polymer using any of the known procedures in the art. Thus certain residual amount of the ester monomeric repeat units may always be present in the polymer employed herein. That is, when a polymer containing repeat units such as NBEtCOOH is used, such polymer may still contain some monomeric repeat units derived from EPEsNB, i.e., the starting monomer.

It should further be noted that more than one distinct types each of monomers of formulae (I) to (III) can be employed in any molar ratios to form the polymer of this invention. That is, one or more monomers of monomer of formula (I) can be employed with one or more monomers of formula (II) and one or more monomers of formula (III) to form the polymers of this invention. Thus, the polymers of this invention generally incorporate repeating units of formula (IA) from about 1 mole percent to about 98 mole percent. The remaining repeat units are being derived from a combination of one or more repeat units of formulae (IIA) and (IIIA). Accordingly, in some embodiments a terpolymer containing any combinations of monomeric repeat units of formula (IA), (IIA) and (IIIA) in which the molar ratios of the repeat units can be 40:30:30, 40:40:20, 50:20:30, 50:25:25, 50:30:20, 50:40:10, 50:45:5, 60:20:20, and the like. In some other embodiments examples of such monomer molar ratio of (I):II):III) employed to form the polymer can range from 1:1:98 to 98:1:1 to 1:98:1 respectively, where the molar ratios of the repeat units of formulae (IA):(IIA):(IIIA) is essentially of the same order. In some other embodiments such ratios include 30:40:30, 40:30:30, 40:40:20, 40:45:15, 40:50:10, 45:40:15, 45:35:20, 50:35:15, 50:40:10 or any such combination.

In general, it has now been found that a polymer containing the monomer repeat unit having an acidic pendent group (generally of formula (IIIA)) advantageously provides certain beneficial effect for the photosensitive composition of this invention. Thus, in some embodiments of this invention, the polymer used in the photosensitive composition of this invention contains a monomer repeat unit containing the acid pendent group from about 10 to 80 mol %, and in some other embodiments from 20 to 70 mol %. In some other embodiments the molar percent of monomer repeat units of formula (IA) in the polymer may be from about 0 to 80 mol %, from about 10 to 80 mol % and in some other embodiments from about 20 to 70 mol %. In some other embodiments the molar percent of monomer repeat units of formula (IIA) in the polymer may be from about 0 to 80 mol %, from about 10 to 80 mol % and in some other embodiments from about 20 to 70 mol %.

It is further noted that it is not necessary to have all three monomers as noted hereinabove to form the appropriate polymer to provide the desirable results as noted herein. It has now been found that a homopolymer containing a repeat unit of any one of the formulae (IA), (IIA) or (IIIA) may also work in this invention. Further, a copolymer having any of the two repeat units of formulae (IA), (IIA) or (IIIA) may also function effectively as the polymer resin in the compositions of this invention. Even more particularly, it has now been found that a copolymer of HFANB and NBEtCO$_2$H can be employed in the photosensitive compositions of this invention. In addition, as already noted above, a terpolymer is used in some of the embodiments of this invention.

The polymers employed in the photosensitive compositions according to this invention generally exhibit a weight average molecular weight ($M_w$) of at least about 5,000. In another embodiment, the polymer employed in this invention has a $M_w$ of at least about 7,000. In yet another embodiment, the polymer has a $M_w$ of at least about 500,000. Further, in an embodiment of this invention the polymer employed herein exhibits a weight average molecular weight of from 5,000 to 500,000, or from 7,000 to 200,000 or from 8,000 to 100,000. The weight average molecular weight ($M_w$) and the number average molecular weight ($M_n$) are generally determined by gel permeation chromatography (GPC) using polystyrene calibration standards. However, any of the other known methods can also be used to determine $M_w$ and $M_n$. From this the polydispersity index (PDI) of the polymer can also be determined ($M_w/M_n$).

In another aspect of this invention, the photosensitive composition of this invention contains a photoactive compound which generally contains a photo active diazo-quinone moiety. Such photoactive compounds (PACs) are known to undergo photo-rearrangement when subjected to actinic (or electromagnetic) radiation of suitable wavelength, such as for example 254, 365, 405, or 436 nm depending upon the nature of the PAC employed the wavelength of the radiation can be modified by employing suitable light source. For example, in some embodiments of this invention the PACs employed contain one or more of the diazo-quinone moiety represented by formula (C), (D) or (E):

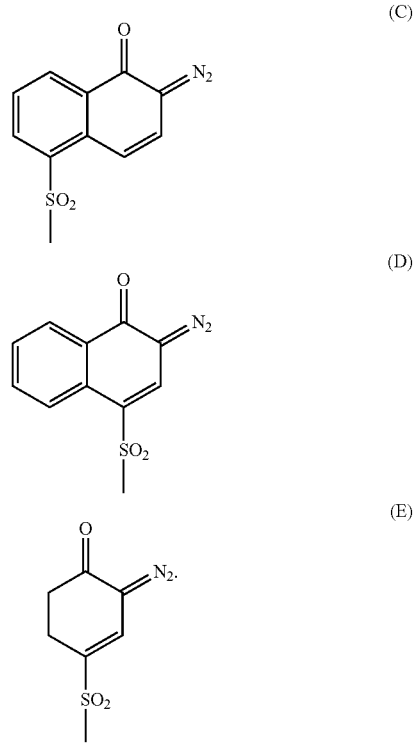

Generally, the structures of Formulae (C), (D) and/or (E) are incorporated into the photosensitive composition as an esterification product of the respective sulfonyl chloride (or other reactive moiety) and a phenolic compound, such as one of structures b-1 through b-6 shown below, each generally referred to as a photoactive compound or PAC, as discussed above. Thus, any one, or any mixture of two or more of such PACs are combined with the polymer in forming a positive tone composition embodiment of the present invention. In each of Formulae (b-1) through (b-6), Q represents any of the structures of Formulae (C), (D) or (E). Advantageously, when a portion of a film or a layer of the photosensitive composition is exposed to appropriate actinic or electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 5 to 50 pphr polymer, where the specific ratio of the photosensitive material to polymer is a function of the dissolution rate of exposed portions as compared to unexposed portions and the amount of radiation required to achieve a desired dissolution rate differential. Advantageous photosensitive materials useful in embodiments in accordance with the present invention are shown in Formulae b-1 through b-6 below; additional useful photosensitive materials are exemplified in U.S. Pat. No. 7,524,594 B2 columns 14-20, pertinent portions of which are incorporated herein by reference:

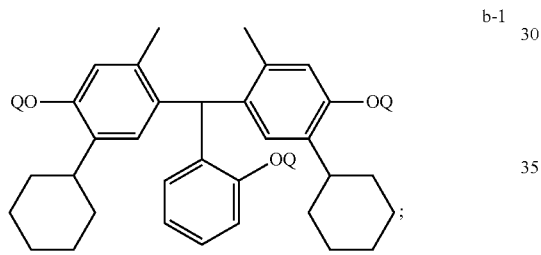

b-1

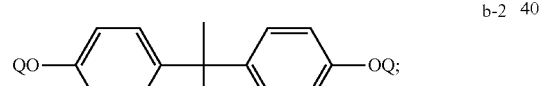

b-2

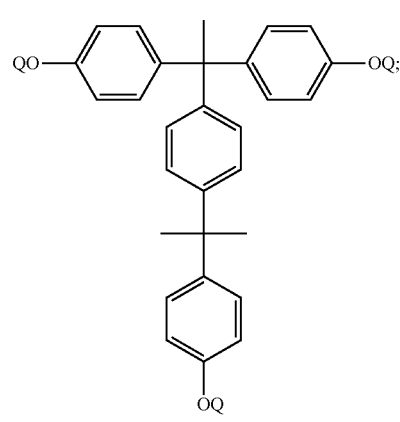

b-3

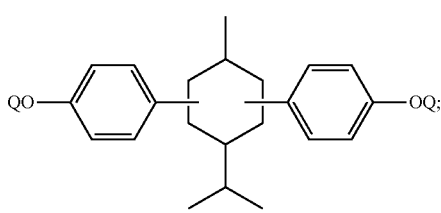

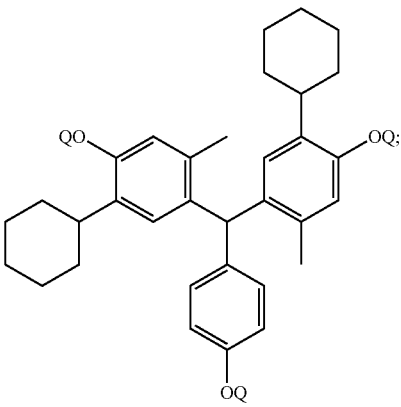

b-4

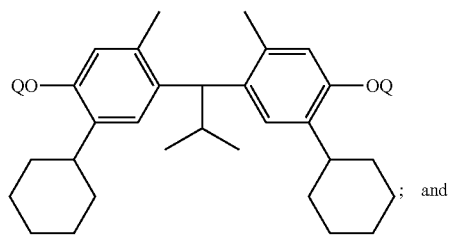

b-5

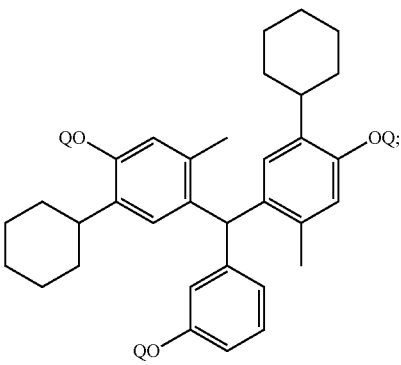

b-6 where at least one of Q is a group of the formula (C) or (D) and any remaining Q is hydrogen. An example of such photoactive compound available commercially include TrisP-3M6C-2(4)-201 from Toyo Gosei.

Any amount of photoactive compound can be employed in the photosensitive composition of this invention which brings about the desired results as described herein. Generally, such amount can range from 1 to 50 parts per hundred parts by mass (pphr) of the polymer (i.e., resin) as described herein. In some other embodiments such amount can range from 5 to 30 pphr.

Advantageously it has now been found that employing at least one suitable multifunctional crosslinking agent of formulae (IV) or (V) as describe herein in the photosensitive compositions of this invention provides a beneficial effect to the compositions of this invention. Such benefits include without any limitation improvement in mechanical and thermal properties, among others.

Any amount of crosslinking agent of formulae (IV) or (V) can be employed in the compositions of this invention that would bring about the intended benefit. In some embodiments the amount of one or more compounds of formulae (IV) or (V) that is employed in the composition of this invention may range from about 8 to 30 parts per hundred parts of the resin (pphr), i.e., the polymer used in such composition. In some other embodiments it ranges from about 10 to 25 pphr; in some other embodiments it ranges from about 12 to 20 pphr; and yet in some other embodiments it ranges from about 14 to 18 pphr. However, it should be noted that higher than 30 pphr of compounds of formulae (IV) or (V) may also be employed especially when more than one compound of formulae (IV) or (V) are employed.

Non-limiting examples of such multifunctional crosslinking agent of formulae (IV) or (V) that can be employed in the compositions of this invention include the following:

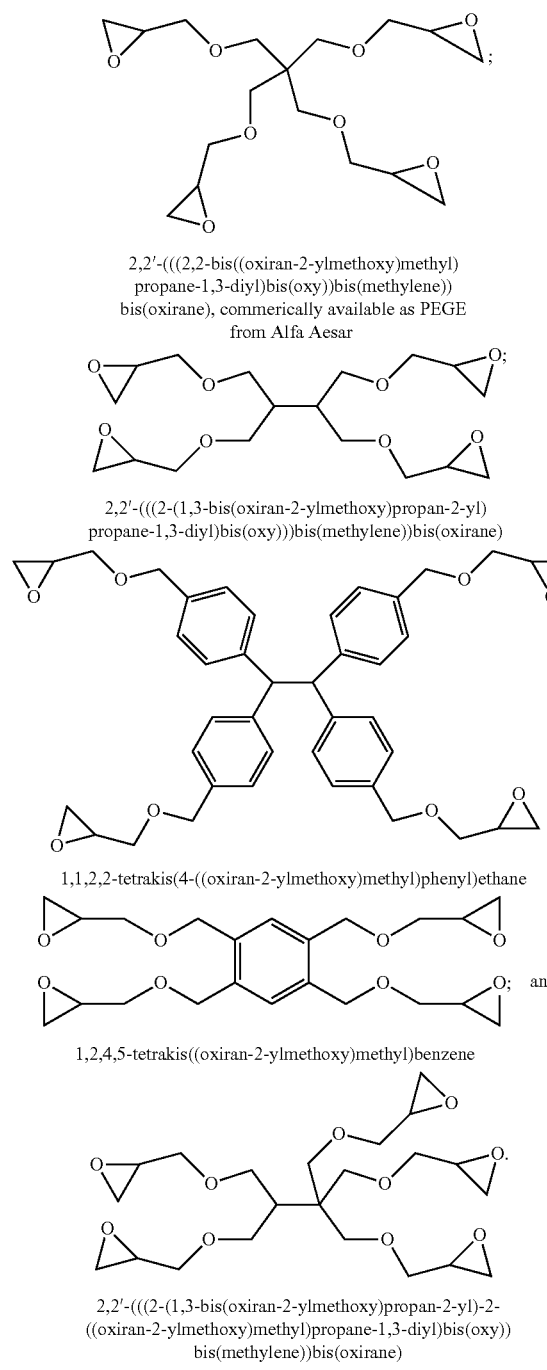

Other suitable crosslinking agents including the following:

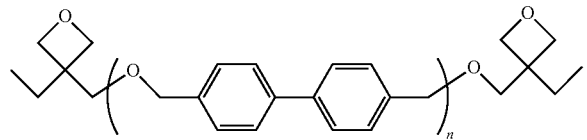

Where n=1 to 3 (OXBP), e.g., when n=1, 4,4'-bis(((3-ethyloxetan-3-yl)methoxy)methyl)-1,1'-biphenyl;

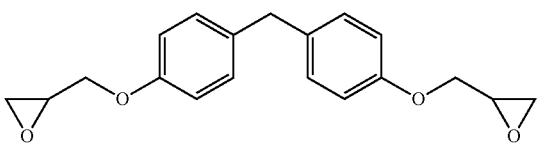 [SMILES: c1cc(OCC2CO2)ccc1Cc1ccc(OCC2CO2)cc1]

bis(4-(oxiran-2-ylmethoxy)phenyl)methane;

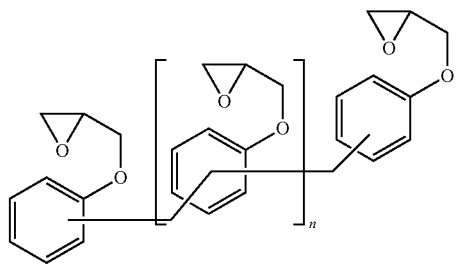

phenol-formaldehyde polymer glycidyl ether, where n=1 to 10 (EPON 862);

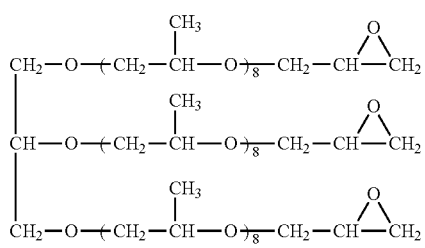

triglycidyl ether of poly(oxypropylene)epoxide ether of glycerol, commercially available as Heloxy 84 or GE-36 from Momentive Specialty Chemicals Inc.;

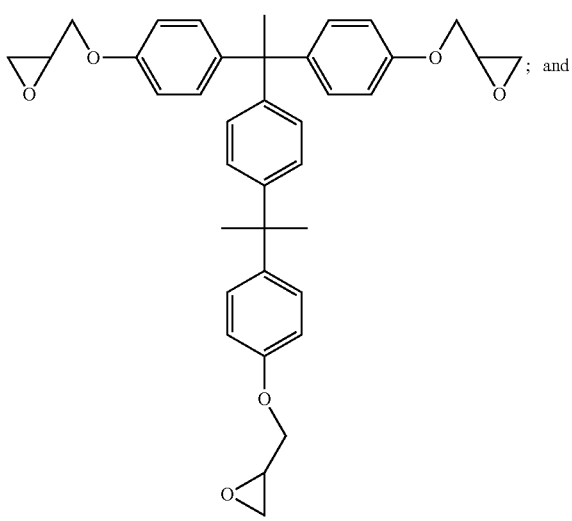

Techmore VG3101L

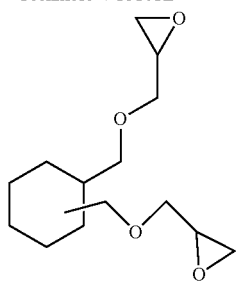

Heloxy 107.

It has been further found that employing any one or more phenolic compounds of formula a-1 to a-6 further provides advantageous benefits to the composition of this invention. Several of these phenolic compounds are available commercially, such as for example, TrisP-3M6C-2 Ballast is available from Toyo Gosei. Again, any amount of one or more of the phenolic compound of formulae a-1 to a-6 can be employed in the photosensitive composition of this invention which brings about the desired results as described herein. Generally, such amount can range from 1 to 25 parts per hundred parts by mass (pphr) of the polymer (i.e., resin) as described herein. In some other embodiments such amount can range from 3 to 20 pphr and in some other embodiments such amount can range from 5 to 15 pphr.

As noted one or more compounds of formula (VI) are also employed in the compositions of this invention. Non-limiting examples of a compound of formula (VI) may be enumerated as follows:

2,2'-methylenediphenol (also referred to as 2,2'-bis(hydroxyphenyl)methane or o,o'-BPF);
4,4'-methylenediphenol;
2,2'-(ethane-1,1-diyl)diphenol;
4,4'-(ethane-1,1-diyl)diphenol;
2,2'-(propane-1,1-diyl)diphenol;
4,4'-(propane-1,1-diyl)diphenol;
2,2'-(propane-2,2-diyl)diphenol;
4,4'-(propane-2,2-diyl)diphenol;
2,2'-(4-methylpentane-2,2-diyl)diphenol;
4,4'-(4-methylpentane-2,2-diyl)diphenol;
2,2'-(5-methylheptane-3,3-diyl)diphenol;
4,4'-(5-methylheptane-3,3-diyl)diphenol;
4,4'-(propane-2,2-diyl)bis(2-cyclohexylphenol);
4,4'-(2-methylpropane-1,1-diyl)bis(2-cyclohexyl-5-methylphenol);
5,5'-(cyclohexane-1,1-diyl)bis(([1,1'-biphenyl]-2-ol));
4,4'-(cyclohexane-1,1-diyl)bis(2-cyclohexylphenol);
4,4'-(4-methylcyclohexane-1,1-diyl)diphenol;
2-cyclohexyl-4-(2-(4-hydroxyphenyl)propan-2-yl)-5-methylphenol;
6,6'-methylenebis(2-(tert-butyl)-4-methylphenol);
6,6'-(2-methylpropane-1,1-diyl)bis(2,4-dimethylphenol);
4,4'-(2-methylpropane-1,1-diyl)bis(2-(tert-butyl)-5-methylphenol);
4-(4-hydroxybenzyl)benzene-1,2,3-triol (also known as 1,2,3-trihydroxy-4-[(4'-hydroxyphenyl)methyl]benzene;
and mixtures in any combination thereof.

Again, any amount of one or more compound of formula (VI) can be employed in the photosensitive composition of this invention which brings about the desired results as described herein. Generally, such amount can range from 5 to 30 parts per hundred parts by mass (pphr) of the polymer (i.e., resin) as described herein. In some other embodiments such amount can range from 7 to 20 pphr and in some other embodiments such amount can range from 9 to 15 pphr.

The photosensitive compositions of the present invention also include additives that are advantageously capable of bonding with the pendant acidic group of the polymer resin. Such materials include, but are not limited to, additives that incorporate one or more epoxy groups such as a glycidyl group, an epoxycyclohexyl group, an oxetane group; an oxazoline group such as 2-oxazoline-2-yl group, a methylol group such as a N-hydroxy methylaminocarbonyl group or an alkoxymethyl group such as a N-methoxy methylaminocarbonyl group. Generally, the aforementioned bonding with the pendant acid group of the polymer is a cross-linking reaction that is initiated by heating to an appropriate temperature, generally above 110° C. for an appropriate amount of time. Accordingly, in some embodiments of this invention, the photosensitive composition of this invention, without any limitation, contains one or more epoxy compounds selected from the following:

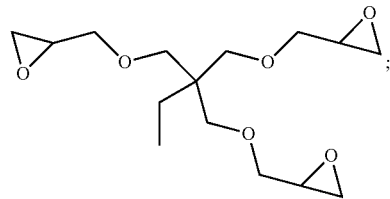

2,2'-(((2-ethyl-2-((oxiran-2-ylmethoxy)methyl)propane-1,3-diyl)bis(oxy))bis(methylene))bis(oxirane), commercially available as Denacol EX321 (Nagase)

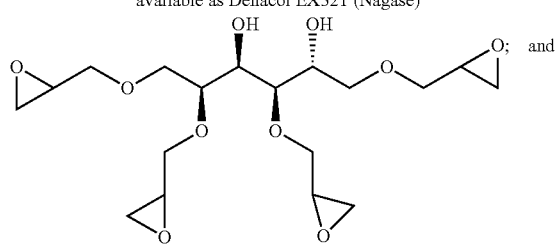

(2R,3R,4R,5S)-1,3-5,6-tetrakis(oxiran-2-ylmethoxy)hexane-2,4-diol(also known as tetrakis-O-(oxiranylmethyl)-D-glucitol)
(Denacol EX-614 from Nagase)

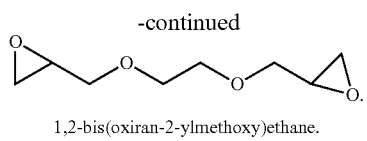

1,2-bis(oxiran-2-ylmethoxy)ethane.

Other exemplary cross-linking or crosslinkable materials that can be used as additives in the forming of a photosensitive composition of the present invention include, among others, bisphenol A epoxy resin, bisphenol F epoxy resin, silicone containing epoxy resins or the like, propylene glycol diglycidyl ether, polypropylene glycol diglycidyl ether, glycidyloxypropyltrimethoxysilane, polymethyl (glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2-oxazoline-2-yl)benzene, 2,2'-bis (2-oxazoline), 2,6-bis(4-isopropyl-2-oxazoline-2-yl)pyridine, 2,6-bis(4-phenyl-2-oxazoline-2-yl)pyridine, 2,2'-isopropylidenebis (4-phenyl-2-oxazoline), (S,S)-(−)-2,2'-isopropylidenebis (4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol and resole type phenol resin or mixtures thereof. It has been found that, in general, such materials are effective at loadings from 5 pphr polymer to 40 pphr polymer. However it should be understood that loadings higher or lower may also prove effective as their efficacy is dependent, at least in part, on the nature of the polymer employed and its mole percent of repeat units encompassing crosslinkable pendent groups.

In another aspect of this invention the photosensitive composition contains a compound or a mixture of compounds that are useful in enhancing the properties of the compositions, including but not limited to increasing the photo-speed and dissolution properties, among various other uses. Advantageously, it has now been found that a compound of formula (VII) can be used as an additive in accordance with the practice of this invention:

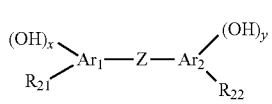

Where x and y are integers from 0 to 4. $R_{21}$ and $R_{22}$ are the same or different and independently of each other selected from hydrogen, halogen, methyl, ethyl, linear or branched $C_3$-$C_{18}$alkyl, $C_1$-$C_{18}$perfluoroalkyl, methoxy, ethoxy, linear or branched $C_3$-$C_{18}$alkoxy, $C_3$-$C_{16}$cycloalkyl, $C_6$-$C_{16}$bicycloalkyl, $C_8$-$C_{16}$tricycloalkyl, $C_6$-$C_{10}$aryl, $C_7$-$C_{18}$aralkyl, —$(CH_2)_wCO_2R_{23}$, —$(CH_2)_zOR_{24}$. $Ar_1$ and $Ar_2$ are the same or different and independently of each other selected from $C_6$-$C_{10}$aryl, $C_7$-$C_{18}$aralkyl, where the aryl or aralkyl groups can further be substituted with any of the possible substituents which are known to one skilled in the art. Z is selected from a bond, O, S, P, —NR—, —C(=O)—, —C(=O)—O—, —C(=O)—NR—, —SO—, —SO$_2$—, —SO$_2$NH— alkyl or any of the carbocyclic bridging group including, cycloalkyl, heterocycloalkyl, aryl, aralkyl, and the like. Where any of the cycloalkyl, bicycloalkyl or tricycloalkyl rings may contain one or more heteroatoms selected form O, S, N, P and Si. Where w is an integer from 0 to 8, $R_{23}$ is hydrogen, methyl, ethyl, linear or branched $C_3$-$C_{18}$alkyl. Where z is an integer from 0 to 8, $R_{24}$ is hydrogen, methyl, ethyl, linear or branched $C_3$-$C_{18}$ alkyl. Where R is hydrogen, methyl, ethyl, linear or branched $C_3$-$C_{18}$alkyl, $C_1$-$C_{18}$perfluoroalkyl, $C_3$-$C_{16}$cycloalkyl, $C_6$-$C_{16}$bicycloalkyl, $C_8$-$C_{16}$tricycloalkyl.

It has been further found that various other phenolic compounds can also be used in the compositions of this invention. Non-limiting examples of such compounds may be selected from the group consisting of:
a compound of formula (VIII):

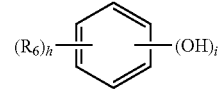

wherein h is an integer from 0 to 4;
i is 1 or 2;
$R_6$ independently is hydrogen, methyl, ethyl, linear or branched $C_3$-$C_{16}$alkyl, $C_3$-$C_8$cycloalkyl, $C_6$-$C_{10}$aryl, $C_7$-$C_{12}$aralkyl or —$CO_2H$;
a compound of formula (IX):

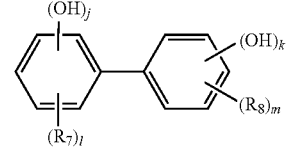

wherein j and k are integers from 1 to 4;
l and m are integers from 0 to 4;
$R_7$ and $R_8$ are the same or different and independently of each other selected from hydrogen, methyl, ethyl, linear or branched $C_3$-$C_6$alkyl, $C_3$-$C_8$cycloalkyl, $C_6$-$C_{10}$aryl and $C_7$-$C_{12}$aralkyl; and
a compound of formula (X):

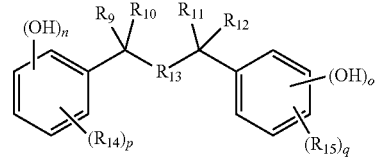

wherein n and o are integers from 1 to 4;
p and q are integers from 0 to 4;
$R_9$, $R_{10}$, $R_{11}$ and $R_{12}$ are the same or different and independently of each other selected from hydrogen, methyl, ethyl, linear or branched $C_3$-$C_6$alkyl; or
when $R_{13}$ is —$(CH_2)_r$—, one of $R_9$ or $R_{10}$ and one of $R_{11}$ or $R_{12}$ taken together with the carbon atoms to which they are attached form a 5 to 8 membered substituted or unsubstituted carbocyclic ring where said substituents are selected from $C_1$-$C_6$alkyl;
$R_{13}$ is —$(CH_2)_r$— or phenylene, where r is 1 to 2; and
$R_{14}$ and $R_{15}$ are the same or different and independently of each other selected from hydrogen, methyl, ethyl, linear or branched $C_3$-$C_6$alkyl, $C_3$-$C_8$cycloalkyl, $C_6$-$C_{10}$aryl and $C_7$-$C_{12}$aralkyl.

Non-limiting examples of additives encompassed by a compound of formula (VIII) may be enumerated as follows:
2-cyclohexylphenol;
4-cyclohexylphenol;
2-cyclohexyl-5-methylphenol;
2,4-di-sec-butylphenol;
2,6-di-tert-butyl-4-methylphenol;
2,4-di-tert-butylphenol;
4-dodecylphenol;
4-ethylresorcinol;
2-propylresorcinol;
4-butylresorcinol;
4-hexylresorcinol (also referred to as 4-hexylbenzene-1,3-diol);
and mixtures in any combination thereof.

Non-limiting examples of additives encompassed by a compound of formula (IX) may be enumerated as follows:
[1,1'-biphenyl]-2,2',4,4'-tetraol;
2'-methyl-[1,1'-biphenyl]-2,3,4,4'-tetraol;
[1,1'-biphenyl]-2,2',4,4',6-pentaol;
[1,1'-biphenyl]-2,2',3,4,4'-pentaol;
and mixtures in any combination thereof.

Non-limiting examples of additives encompassed by a compound of formula (X) may be enumerated as follows:
4,4',4''-(butane-1,1,3-triyl)tris(2-(tert-butyl)-5-methylphenol);
4,4'-(4-isopropyl-1-methylcyclohexane-1,3-diyl)diphenol;
4,4'-(1,4-phenylenebis(propane-2,2-diyl))bis(2-cyclohexyl-5-methylphenol);
4,4'-(1,3-phenylenebis(propane-2,2-diyl))bis(2-cyclohexyl-5-methylphenol);
4,4'-(1,4-phenylenebis(propane-2,2-diyl))bis(2-cyclohexylphenol);
4,4'-([1,1'-bi(cyclohexane)]-4,4'-diyl)diphenol;
4-(4-(4-hydroxyphenyl)cyclohexyl)-2-methylphenol;
and mixtures in any combination thereof.

Various other compounds that can be used in the compositions of this invention may be enumerated as follows:

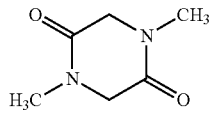

1,4-dimethylpiperazine-2,5-dione (also known as sarcosine anhydride);
1-ethyl-4-methylpiperazine-2,5-dione;
1,4-diethylpiperazine-2,5-dione;
1-methyl-4-propylpiperazine-2,5-dione;
1-ethyl-4-propylpiperazine-2,5-dione;
1-ethyl-4-isopropylpiperazine-2,5-dione;
and mixtures in any combination thereof.

In some other embodiments the following compounds can also be used in the composition of this invention:
bis(oxiran-2-ylmethyl) cyclohexane-1,2-dicarboxylate;
bis(oxiran-2-ylmethyl) cyclohexane-1,3'-dicarboxylate;
bis(oxiran-2-ylmethyl) cyclohexane-1,4-dicarboxylate;
bis(oxiran-2-ylmethyl) phthalate;
bis(oxiran-2-ylmethyl) isophthalate;
bis(oxiran-2-ylmethyl) terephthalate;
and mixtures in any combination thereof.

In general among other things, various compounds and additives as enumerated herein improve overall performance of the photosensitive compositions of this invention thus providing well defined photo-patterned structures having a variety of utilities, including but not limited to chip-stack applications, redistribution layers and for forming CMOS image sensor dam structures. Advantageously, it has also been found that certain of the additives as described herein may feature more than one function. For example, some of the additives as enumerated hereinabove may not only exhibit certain dissolution enhancement activity post-exposure but may also facilitate as a cross linking agent as further described above. Therefore, additives as used herein do not limit the activity of such compounds to only one of such property but may also facilitate other functions of the photosensitive compositions of this invention.

It should further be noted that any of the additives noted above and represented by structural formulae (VI) to (X) can be used alone, i.e., as a single compound and/or a combination of one or more compounds in any combination thereof. That is, for example, in some embodiments one or more compounds of formula (VI) may be used in combination with any of the other compounds of formula (VII) to (X), such as for example a compound of formula (VI) in combination with a compound of formula (VII) or a compound of formula (VIII) or a compound of formula (IX) or a compound of formula (X), and so on. In addition, the amount of the additive that can be used depends upon the intended result with the photosensitive composition of this invention.

Accordingly, any amount that would bring about the intended result can be used in this invention. In general, the amount of additive that can be used can range from 0.5 to 20 pphr, and in some embodiments such amounts are in the range of from 1 to 12 pphr.

It has further been found that various other compounds described by structural formulae (XIa)-(XIh) can also be used as one or more additives, alone or in combination with any of the compounds of formulae (VI) to (X) enumerated above in order to form the photosensitive compositions of this invention. It should further be noted that these additives, i.e., compounds described by structural formulae (XIa)-(XIh), can be used alone or as a mixture in any combination thereof, and in any desirable amounts.

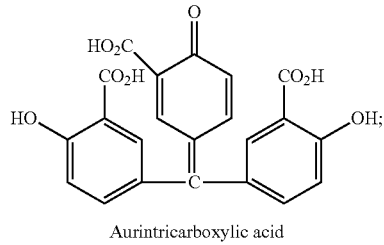

Aurintricarboxylic acid

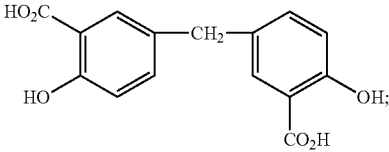

5,5'-Methylenedisalyicyclic acid

-continued

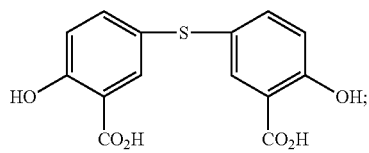

5,5'-Thiodisalicyclic Acid

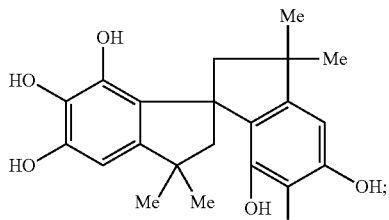

3,3,3',3'-Tetramethyl-1,1'-spirobiindan-5,5',6,6',7,7'-hexol

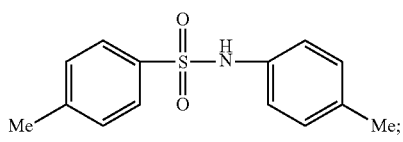

p-Toluenesulfono-p-toluidide

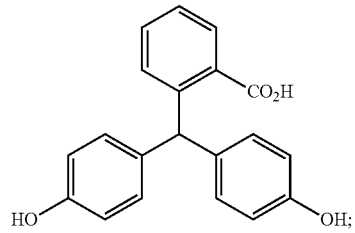

Phenolphthalin

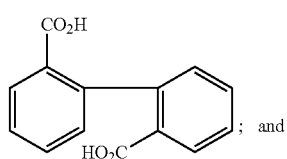

Diphenic acid

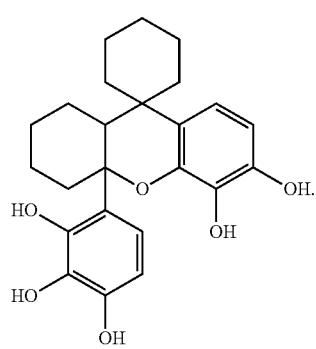

4-(5',6'-dihydroxy-1',3',4', 9a'-tetrahydrospiro[cyclohexane-1,9'-xanthen]-4a'(2'H)-yl)benzene-1,2,3-triol, also commonly known as Pyrogallol-FZ In a further aspect of this invention various other additives which may be suitable to use with the composition of this invention include, without any limitation, the following:

(XIc)

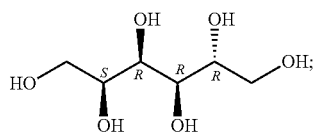

D-Sorbitol (XId)

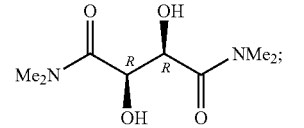

Absolute stereochemistry, Rotation (+)
(+)-N,N,N'N'-Tetramethyl-L-tartaric acid diamide (XIe)

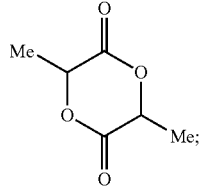

Lactide (XIf)

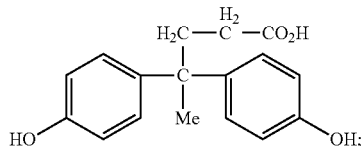

Diphenolic acid (XIg)

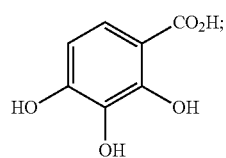

2,3,4-Trihydroxybenzoic acid (XIh)

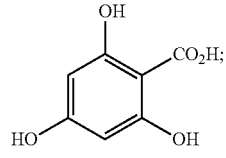

2,4,6-Trihydroxybenzoic acid (hydrate)

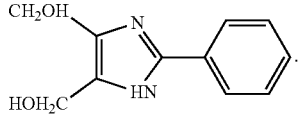

4,5-Dihydroxymethyl-2-phenylimidazole

The photosensitive composition of this invention further encompasses one or more compounds having utility as, among other things, adhesion promoters, antioxidants, crosslinking, coupling or curing agent, and the like. Non-limiting examples of such compounds are selected from the group consisting of the following, commercially available materials are indicated by such commercial names.

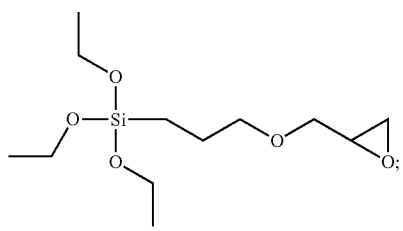

triethoxy(3-(oxiran-2-ylmethoxy)propyl)silane, also commonly known as 3-glycidoxypropyl triethoxysilane (3-GTS or (KBE-403 from Shin-Etsu Chemical Co., Ltd.))

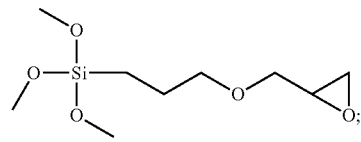

trimethoxy(3-(oxira-2-ylmethoxy)propyl)silane, also commonly known as 3-glycidoxypropyl trimethoxysilane (KBM-403 from Shin-Etsu Chemical Co., Ltd.))

$C_6H_5(CH_3O)_3Si$
phenyltrimethoxysilane
$C_6H_5(C_2H_5O)_3Si$
phenyltriethoxysilane (KBE-103 commercially available from Gelest or Shin-Etsu Chemical Co., Ltd.)

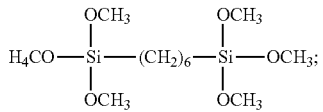

3,3,10,10-tetramethoxy-2,11-dioxa-3,10-disiladodecane (SIB-1832 from Gelest)

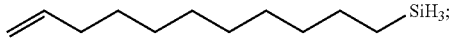

undec-10-en-1-ylsilane (SIU9048.0)

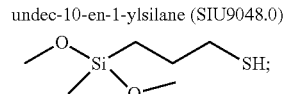

3-(dimethoxy(methyl)silyl)propane-1-thiol (SIM5474.0)

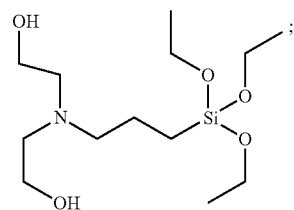

2,2'-((3-(triethoxyilyl)propyl)azanediyl)bis(ethan-1-ol) (SIB1140.0)

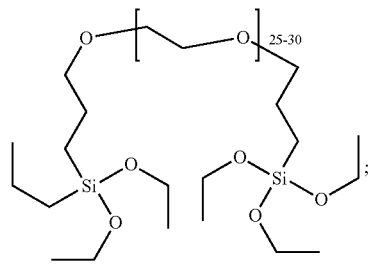

N,N'-bis[(3-triethoxysilylpropyl)aminocarbonyl] polyethylene oxide (SIB-1824.84 from Gelest)

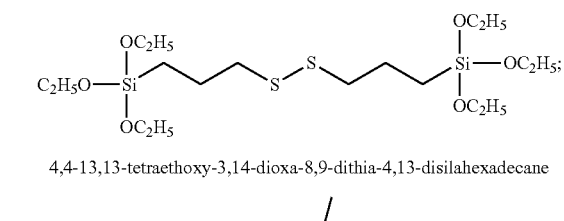

4,4-13,13-tetraethoxy-3,14-dioxa-8,9-dithia-4,13-disilahexadecane

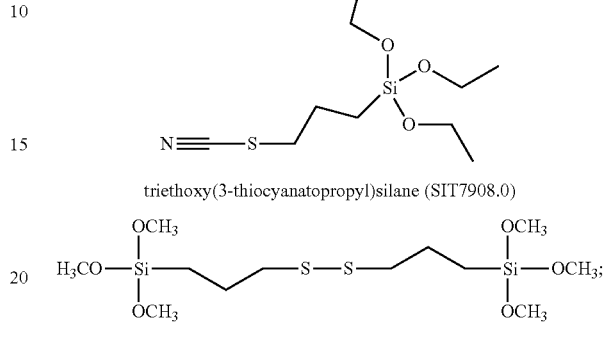

triethoxy(3-thiocyanatopropyl)silane (SIT7908.0)

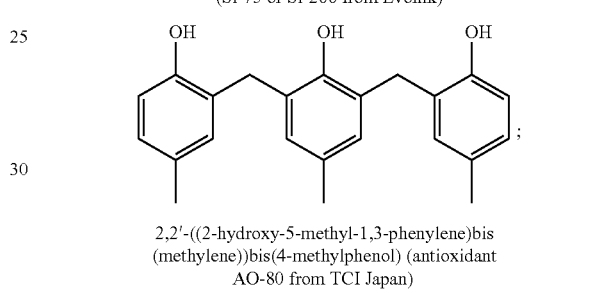

3,3,12,12-tetramethoxy-2,13-dioxa-7,8-dithia-3,12-disilatetradecane (Si-75 or Si-266 from Evonik)

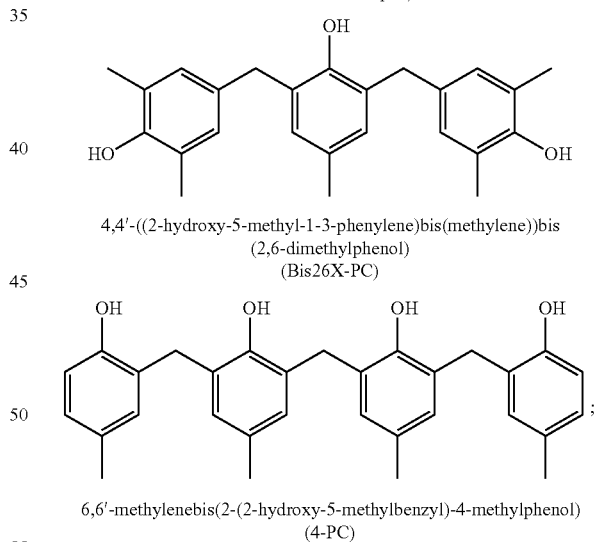

2,2'-((2-hydroxy-5-methyl-1,3-phenylene)bis(methylene))bis(4-methylphenol) (antioxidant AO-80 from TCI Japan)

4,4'-((2-hydroxy-5-methyl-1-3-phenylene)bis(methylene))bis(2,6-dimethylphenol) (Bis26X-PC)

6,6'-methylenebis(2-(2-hydroxy-5-methylbenzyl)-4-methylphenol) (4-PC)

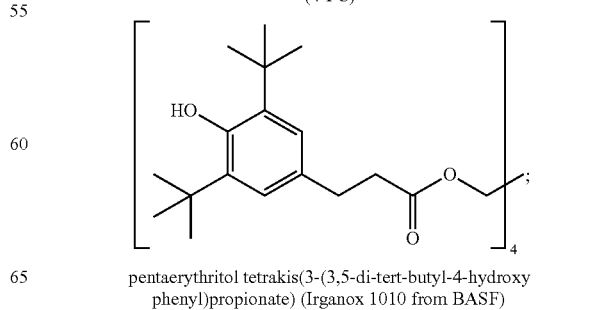

pentaerythritol tetrakis(3-(3,5-di-tert-butyl-4-hydroxy phenyl)propionate) (Irganox 1010 from BASF)

-continued

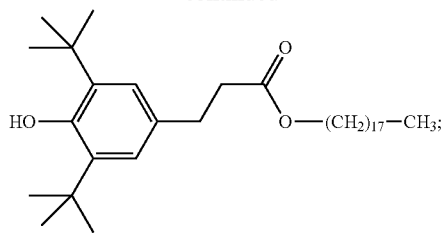

3,5-bis(1,1-dimethylethyl)-4-hydroxy-octadecyl ester
Benzenepropanoic acid (Irganox 1076 from BASF)

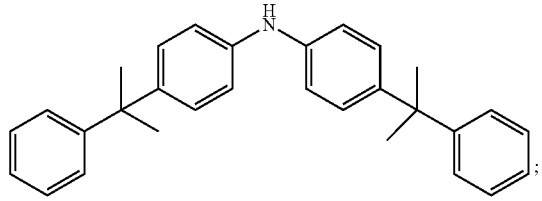

bis(4-(2-phenylpropan-2-yl)phenyl)amine (Naugard 445 (NG445)
commercially available from Chemtura)

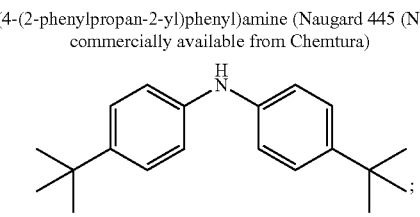

bis(4-(tert-butyl)phenyl)amine (Stearer Star from
Seiko Chemical Products)

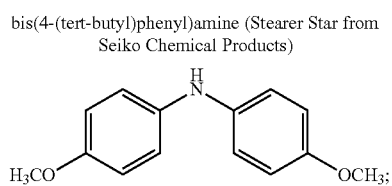

bis(4-methoxyphenyl)amine (Thermoflex)

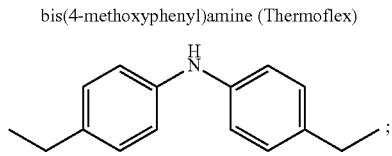

bis(4-ethylphenyl)amine

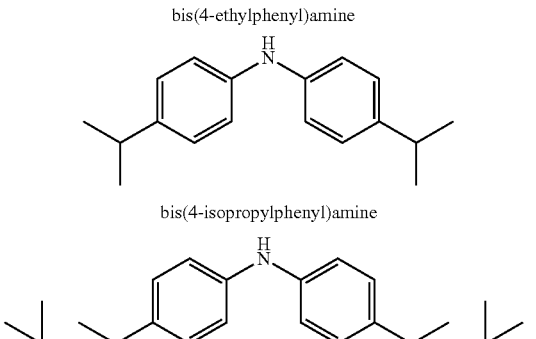

bis(4-isopropylphenyl)amine

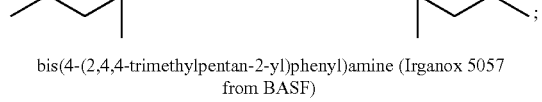

bis(4-(2,4,4-trimethylpentan-2-yl)phenyl)amine (Irganox 5057
from BASF)

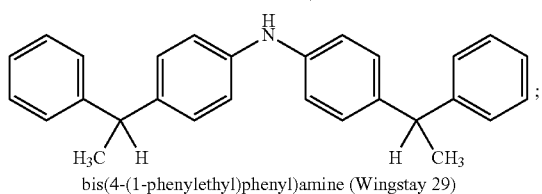

bis(4-(1-phenylethyl)phenyl)amine (Wingstay 29)

-continued

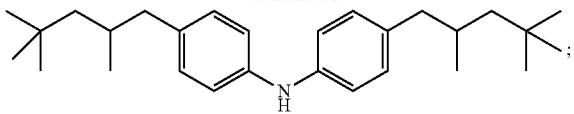

bis(4-(2,4-4-trimethylpentyl)phenyl)amine (Irganoz L 57 from BASF)

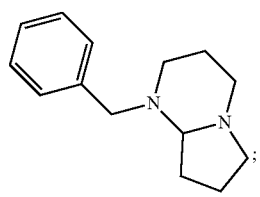

1-benzyloctahydropyrrolo[1,2-a]
pyrimidine (CGI-90 from BASF)

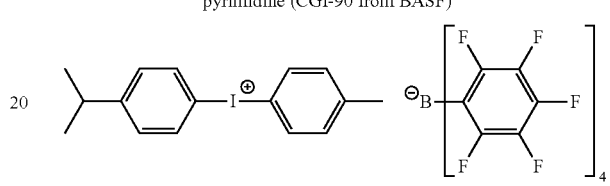

tetrakis(2,3,4,5,6-pentafluorophenyl)borate(1-)[4-(1-methylethyl)
phenyl](4-methylphenyl)-Iodonium (Rhodorsil PI 2074 from Blue
Star Silicones)

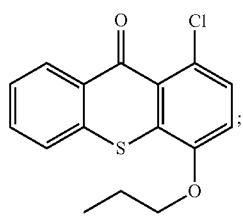

1-chloro-4-propoxy-9H-
Thioxanthen-9-one (CPTX
from Lambson PLC)

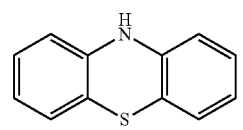

10H-phenothiazone (Phenothiazine
from Kanto)

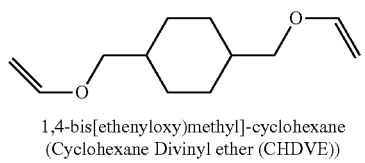

1,4-bis[ethenyloxy)methyl]-cyclohexane
(Cyclohexane Divinyl ether (CHDVE))

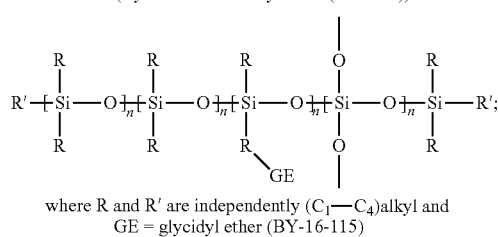

where R and R' are independently $(C_1$—$C_4)$alkyl and
GE = glycidyl ether (BY-16-115)

-continued

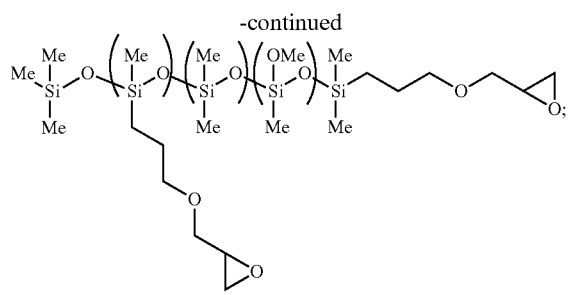

Silicone modified epoxy compound commercially available as BY16-115 from Toray-Dow Corning Silicone Co., Ltd.

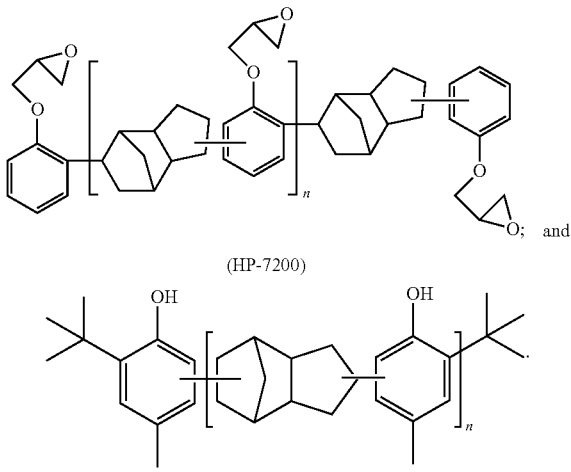

Still other exemplary epoxy resins or cross-linking additives include, among others Araldite MT0163 and Araldite CY179 (manufactured by Ciba Geigy); and EHPE-3150, Epolite GT300 and (manufactured by Daicel Chemical).

It should again be noted that any one of these compounds can be used alone or as mixtures in any combination thereof, and only if needed depending upon the intended use and to obtain the desirable benefit. Again, any amount of one or more of aforementioned compounds can be used in the photosensitive composition of this invention so as to bring about the desired results. Generally it has now been found that such amounts can range from 0.5 to 20 parts per hundred parts of the polymer resin (pphr). In some embodiments such amounts range from 1 to 10 pphr.

Photosensitive compositions in accordance with the present invention may also encompass other components as may be useful for the purpose of improving the properties of both the composition and the resulting film or the polymer layer. For example, the sensitivity of the composition to a desired wavelength of exposure radiation may result in improved desirable properties as further described below. Examples of such optional components may include without any limitation one or more compounds/various additives such as surfactants, silane coupling agents, leveling agents, phenolic resins, antioxidants, flame retardants, plasticizers, and curing accelerators.

The photosensitive composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example spin coating, spraying, doctor blading, meniscus coating, ink jet coating and slot coating.

Next, the coated substrate is heated to facilitate the removal of residual casting solvent, for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photoactive compound and/or photosensitizer incorporated into the polymer composition as described herein. However, generally such appropriate wavelength is from 200 to 700 nm. It will be understood that the phrase "imagewise exposure" means exposing through a masking element to provide for a resulting pattern of exposed and unexposed portion of the film.

After an imagewise exposure of the film formed from photosensitive composition or formulation embodiments in accordance with the present invention, a development process is employed. For the positive tone polymer formulations of the present invention, such development process removes only exposed portions of the film thus leaving a positive image of the masking layer in the film. For the negative tone polymer formulations of the present invention, such development process removes only unexposed portions of the film thus leaving a negative image of the masking layer in the film. For some embodiments, a post exposure bake can be employed prior to the aforementioned development process.

Suitable developers, particularly for positive tone formulations, can include aqueous solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as propylene glycol methyl ether acetate (PGMEA), 2-heptanone, cyclohexanone, toluene, xylene, ethyl benzene, mesitylene and butyl acetate, among others.

Thus some formulation embodiments of the present invention provide self-imageable films that after imagewise exposure, the resulting image is developed using an aqueous base solution, while for other such embodiments the resulting image is developed using an organic solvent. Regardless of which type of developer is employed, after the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has not been exposed during the imagewise exposure, image fixing is generally accomplished by causing a reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. The heating is generally carried out at a desirable temperature, for example, from above 110° C. for a time of from 40 min to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

The devices are produced by using embodiments of the alkali soluble photosensitive resin composition of the present invention to form layers which are characterized as having high heat resistance, an appropriate water absorption rate, high transparency, and low permittivity. In addition, such layers generally have an advantageous coefficient of elasticity after curing, 0.1 kg/mm$^2$ to 200 kg/mm$^2$ being typical.

As previously mentioned, exemplary applications for embodiments of the photosensitive compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, and printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a positive tone photosensitive polymer composition which exhibits enhanced characteristics with respect to one or more of mechanical properties (such as low-stress retained elongation to break after aging) and at least equivalent chemical resistance, as compared to alternate materials. In addition such embodiments provide generally excellent electrical insulation, adhesion to the substrate, and the like. Thus semiconductor devices, device packages, and display devices are provided that incorporate embodiments in accordance with the present invention.

Advantageously, it has now been found that the photosensitive compositions of this invention are useful to form adhesive layers for bonding the semiconductor chips to each other, such as in chip-stack applications. For example, a bonding layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it is now possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it is now possible to form a variety of electronic devices featuring hitherto unachievable level of miniaturization, thinning and light-weight, and the function of the semiconductor device is not easily damaged even if such devices are subject to rugged operations such as swinging or dropping.

A cured product of the photosensitive adhesive composition of the present invention, i.e., the adhesive layer or the film generally exhibits an indentation modulus of 2 to 3.5 GPa at 25° C. The cured product of the photosensitive adhesive composition of the present invention exhibits an indentation modulus of 70 to 120% of the indentation modulus of the non-cured product at 25° C., i.e., before such curing step. Further, the photosensitive adhesive composition of the present invention exhibits an excellent adhesiveness to a suitable substrate, such as for example a semiconductor chip, and adhesiveness of 20 to 200 Newton (N) at 25° C. can be achieved before curing and generally after etching and ashing process.

Thus, it has now been found that the photosensitive adhesive composition of the present invention exhibits an indentation modulus at room temperature after curing which is relatively comparable to the indentation modulus of the uncured sample and not causing significant stress concentration between the semiconductor chips but contributing to forming of the adhesive layer with sufficient adhesiveness. Further, since the indentation modulus in a state before cured is within the predetermined range of indentation modulus after cured, and then, for example, it is not so possible that the photosensitive adhesive composition before cured is significantly deformed or flowed out, it is possible to increase the accuracy of alignment in laminating the semiconductor chips. Furthermore, since the change in indentation modulus before and after curing is relatively small, the shrinkage associated with photosensitivity can be reduced and then the stress at the interface between the semiconductor chips caused by shrinkage on curing can be reduced. This point also contributes to improvement of the reliability of the chip laminate.

On the other hand, advantageously, the photosensitive adhesive composition of the present invention in a state before cured after etching process and ashing process has sufficient stickiness with the semiconductor chip as required in die bonding. Therefore, the adhesive layer for bonding the semiconductor chips to each other securely fixes the semiconductor chips to each other and contributes to improvement of the reliability of the chip laminate.

From the above, according to the photosensitive adhesive composition of the present invention, it is possible to realize the adhesive layer having sufficiently both adhesiveness and stress relaxation. In other words, since the adhesive layer has both element protective function of buffer coat film (or, buffer coat function) and adhesive function of die bonding film (or, die bonding function) with a single layer, it is possible to form the chip laminate without decreasing the reliability and to thin the chip laminate as compared to the conventional one in two layers as well. Further, it is possible to reduce the volume of the mold portion and to shorten the bonding wire due to thinning of the chip laminate, thereby these factors contribute to light-weight and cost-savings.

Accordingly, in some of the embodiments, the indentation modulus of the cured product of the photosensitive adhesive composition of the present invention is generally 2 to 3 GPa at 25° C. as described above, and further, in some other embodiments it is about 2.2 to 3.2 GPa and few other embodiments it is about 2.4 to 3.0 GPa. Incidentally, with the indentation modulus of the cured product being less than the above lower limit, the adhesiveness of the adhesive layer is reduced, thereby the interface of the layer with the semiconductor chip is peeled, and, when the filler is contained in the mold part, the filler may pass through the adhesive layer and adversely affect the semiconductor chip. Meanwhile, with the indentation modulus of the cured product being more than the above upper limit, the flexibility of the adhesive layer is reduced, thereby stress relaxation is lowered and it is impossible to mitigate, for example, residual stress generated in accordance with lamination of the semiconductor chips and local concentration of thermal stress due to thermal expansion difference between the semiconductor chips and the adhesive layer. Consequently, cracks are made in the semiconductor chips, or the semiconductor chip and the adhesive layer are peeled off from each other. Such problems are readily overcome by the use of the photosensitive adhesive compositions of this invention.

In addition, the indentation modulus of the cured product is measured with a nanoindenter at 25° C.

Further, the melt viscosity of the photosensitive adhesive composition of the present invention in a state before cure is generally from about 20 to 500 Pascal-second (Pa·s) in the range of 100 to 200° C. Because such composition is superior in wettability with respect to the semiconductor chip 20 (FIG. 2), it becomes hard to generate voids or the like in the adhesive layer. Therefore, since it is possible to form homogeneous adhesive layers with little unevenness of physical properties, the adhesive layer hardly leads to local concentration of stress when the semiconductor chips are adhered together through the adhesive layer. Thereby, it is possible to inhibit the occurrence of cracks in the semiconductor chips and the occurrence of delamination between the adhesive layer and the semiconductor chip.

The melt viscosity of the cured photosensitive adhesive composition of the present invention may be measured by a rheometer. Accordingly, in some of the embodiments of this invention, the melt viscosity before cure is from about 25 to 400 Pa s, and in some other embodiments it is from about 30 to 300 Pa s.

Further, while the photosensitive adhesive composition of the present invention in a state before cure has certain adhesiveness, the adhesiveness can be decreased by performing UV irradiation thereon. Therefore, the photosensitive adhesive composition of the present invention may be controllable in adhesiveness depending on UV irradiation.

Specifically, the photosensitive adhesive composition of the present invention in a state before curing and after etching and ashing process as described above has stickiness generally greater than about 3.0 N/25 mm at 25° C. with respect to a back grinding tape capable of releasing upon UV irradiation. Since the photosensitive adhesive composition of the present invention may achieve sufficient stickiness with respect to the back grinding film even after performing certain processes such as etching process and ashing process accelerating the deterioration of the organic material, it is still possible to fix securely a semiconductor wafer, when dicing process is performed to the semiconductor wafer formed with a film of the photosensitive adhesive composition of the present invention, thereby dicing accuracy can be improved.

Accordingly, in some of the embodiments of this invention the stickiness (i.e., bond strength) referred to hereinabove is from 3.5 to 10.0 N/25 mm.

On the other hand, the photosensitive adhesive composition of the present invention in a state before cured and after UV irradiation has stickiness generally not more than 0.5 N/25 mm at 50° C. with respect to a back grinding tape capable of releasing upon UV irradiation. Since the photosensitive adhesive composition of the present invention features less tackiness with respect to the back grinding tape upon UV irradiation, when a chip is picked up after dicing process, it is easy to separate between the dicing tape and the coating film, thus preventing any potential defects, such as breaking of the chip, among others.

Further, by reducing stickiness (i.e., the tackiness), it is possible to inhibit, for example, the photosensitive adhesive composition of the present invention from sticking to the dicing blade in the dicing process, and sticking to the collet in the mounting process. As a result, it is possible to inhibit failure in dicing or picking-up from occurring.

Accordingly, in some of the embodiments of this invention the stickiness referred to hereinabove is from 0.05 N/25 mm 0.4 N/25 mm.

Further, the above UV irradiation process is a process of irradiating using light with wavelength of 365 nm with an exposure dose of up to 600 mJ/cm$^2$ in integrated amount of light. In some embodiments the exposure dose of the light source is in the range of from about 100 to 500 mJ/cm$^2$. In some other embodiments the exposure dose of the light source is in the range of from about 150 to 400 mJ/cm$^2$. In yet some other embodiments the exposure dose of the light source is in the range of from about 200 to 250 mJ/cm$^2$.

It has now been found that by employing the photosensitive compositions of this invention very high resolution circular vias can be formed. The resolution of the vias can be in the range from 1 to 100 µm. In some other embodiments, the resolution of the vias can be in the range from 3 to 30 µm. In yet some other embodiments, the resolution of the vias can be in the range from about 5 to 15 µm.

Further, the back-grinding UV peeling tape used in the above embodiments is generally made of acrylic resin. However, any other tape which can bring about the above noted result can also be employed.

Accordingly, in some embodiments of this invention as described above, the photosensitive composition is soluble in an alkali developer.

Further, in some embodiments of this invention as described above, the electronic and/or the semiconductor device according to this invention encompass a laminated semiconductor element where said lamination consists of a photosensitive composition according to the present invention.

In some embodiments of this invention, the semiconductor device encompassing a redistribution layer (RDL) structure further incorporates a photosensitive composition according to this invention.

Further, in some embodiments of this invention as described above, the semiconductor device encompassing a chip stack structure further includes a photosensitive composition according to this invention.

In yet some other embodiments of this invention as described above, the semiconductor device encompassing a complementary metal oxide semiconductor (CMOS) image sensor dam structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a photosensitive composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photopattern; and curing the film by heating to a suitable temperature.

The coating of the substrate with photosensitive composition of this invention can be performed by any of the coating procedures as described herein and/or known to one skilled in the art, such as by spin coating.

In addition, the developing in accordance with the method of this invention can be performed by any of the known developing techniques such as by the use of an aqueous developer.

In some embodiments of this invention, the method according to this invention utilizes a developer, which is aqueous tetramethylammonium hydroxide (TMAH).

In addition, in some of the embodiments of this invention, a substrate is first hardbaked in the method according to this invention before the curing step at a temperature of from 130° C. to 160° C. for 20 minutes to 60 minutes.

Finally, in some other embodiments of this invention, the curing is performed at a temperature of from 170° C. to 200° C. at an incremental heating ramp of 5° C. and for 1 to 5 hours.

EXAMPLES

The polymers used to form the photosensitive compositions of this invention are generally known in the literature and are prepared in accordance with the well-known literature procedures. See for example U.S. Pat. No. 9,696,623 B2, pertinent portions of which are incorporated herein by reference.

Example 1

In general any of the polymers as described herein can be used. For example, a terpolymer of polynorbornene derivatives as described herein was dissolved in a suitable solvent such as propylene glycol methyl ether acetate (PGMEA) having the specific amounts of additives, expressed as parts per hundred resin (pphr), as summarized in Table 1 were mixed in an appropriately sized amber HDPE bottle. The mixture was rolled for 18 hours to produce a homogeneous solution. Particle contamination was removed by filtering the polymer solution through a 0.45 μm pore polytetrafluoroethylene (PTFE) disc filter under 35 psi pressure, the filtered polymer solution was collected in a low particle HDPE amber bottle and the resulting solution stored at 5° C.

TABLE 1

| Ingredients (pphr) | Example 1 | Comp. Example 1 |
|---|---|---|
| Terpolymer | 100 | 100 |
| Photoactive compound | 14 | 15.5 |
| Ter functional epoxy compound | 7 | 20 |
| Tetra functional epoxy compound | 14 | 0 |
| Adhesion promoter package | 13.5 | 13.5 |
| Anti-oxidant package | 3 | 11.5 |
| Multi-functional phenolic compound package | 17 | 23 |

The composition thus formed was brought to room temperature and was applied to several 125 mm diameter silicon wafers (thickness: 625 μm) by spin coating initially at 200 rpm for 10 seconds and then at 500 rpm for 30 seconds. The substrates so formed were then placed on a 120° C. hot plate for 4 minutes, providing about a 2 microns (μm) thick polymer film. Each of the polymer film was then imagewise exposed through a range of exposure energies from 125-500 mJ/cm$^2$. Each film was then developed using a puddle development method having about two 5 second immersions in 0.26N TMAH. After the develop process each wafer was rinsed by spraying deionized water for 5 seconds and then dried by spinning at 3000 rpm for 15 seconds.

FIG. 1 shows photolithographic images obtained using a representative composition of this invention using different exposure energy. Specifically, FIGS. 1A to 1D show photolithographic images taken using a Stepper and a Mask Aligner at a threshold exposure dose of 125 mJ/cm$^2$, 175 mJ/cm$^2$, 225 mJ/cm$^2$ and 300 mJ/cm$^2$ respectively.

Comparative Example 1

A composition substantially similar to Example 1 was prepared but contained no tetra functional epoxy compound package but a few other additives as summarized in Table 1 for Comparative testing as described in Examples 2 and 3.

Example 2

Die Shear Strength Measurements

The composition as described in Example 1 was spin-coated onto a silicon wafer and baked at 120° C. for 4 min to a film thickness of 10 μm. The film was hardbaked at 150° C. for 40 min. Then, the wafer was singulated into 10 mm×20 mm chips. Next, the chips were placed on a 150° C. hotplate while a separate 4 mm×4 mm silicon chip was pressed into the surface of the coated singulated chip with a force of 1 kg-f for 1 second. The bonded chips were transferred to a nitrogen oven where the composition of Example 1 was cured at 180° C. for 2 hr. After curing, the chip assembly was transferred to a heated stage (260° C.) where the 4 mm×4 mm die was sheared off from the 10 mm×20 mm chip containing the composition of Example 1. The die shear forces were measured and recorded.

Similarly, samples were also made substantially in the same fashion as described above except for using the composition of Comparative Example 1.

FIG. 2 shows the results obtained from the die shear measurements. It is clear from this data that the composition of Example 1 is surprisingly much superior to that of the Comparative Example 1.

Example 3

The composition as described in Example 1 was spin-coated onto a suitable substrate and baked at 120° C. for 4 min. The coated film was then image-wise exposed to suitable actinic radiation using a mercury vapor lamp (200-450 nm). The exposed substrate was then developed using tetramethylammonium hydroxide (TMAH) developer to reveal the unexposed region. Then the substrates were heated to a temperature in the range of from around 150° C. to 240° C. for an extended time up to 2 hours to cure fully the composition of this invention. The cured samples were then exposed to acidic etchant to remove any oxidized surface. The temperature of the etchant was maintained at a temperature range from about ambient room temperature up to 50° C. for about 5 minutes to 15 minutes. After the etching process the polymer samples are observed under optical microscopy to observe any delamination or over etching that occurred during the process. Various compositions made in accordance of this invention showed less delamination when compared with Example 1 as well as Comparative Example 1.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A photosensitive composition comprising:
   a) a polymer having a first type of repeating unit of formula (IA) derived from a monomer of formula (I):

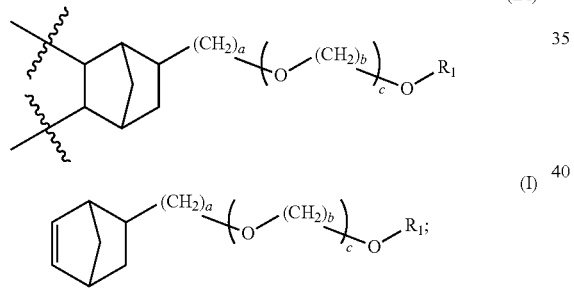

a second type of repeating unit of formula (IIA) derived from a monomer of formula (II):

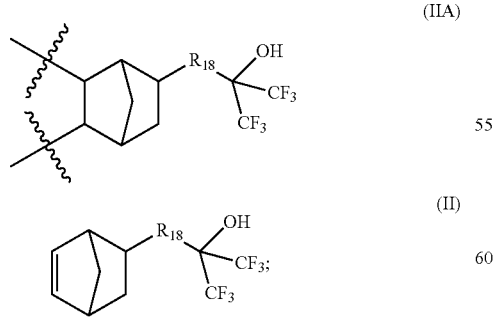

and
a third type of repeating unit of formula (IIIA) derived from a monomer of formula (III):

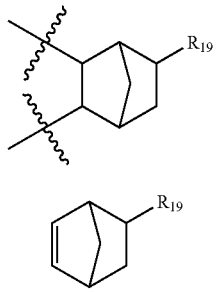

wherein:
~~~~ represents a position at which the bonding takes place with another repeat unit;
a is an integer from 0 to 3;
b is an integer from 1 to 4;
c is an integer from 1 to 4;
$R_1$ is selected from the group consisting of hydrogen, methyl, ethyl, n-propyl, i-propyl and n-butyl;
$R_{18}$ is selected from $-(CH_2)_s-$, $-(CH_2)_t-OCH_2-$ or $-(CH_2)_t-(OCH_2CH_2)_u-OCH_2-$, where
s is an integer from 0 to 6,
t is an integer from 0 to 4;
u is an integer from 0 to 3;
$R_{19}$ is $-(CH_2)_v-CO_2R_{20}$ where v is an integer from 0 to 4, and
$R_{20}$ is hydrogen or $C_1$-$C_4$ alkyl;
b) a photo active compound containing a diazo-quinone moiety of formula (A):

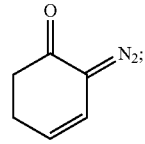

c) a multifunctional crosslinking agent selected from the group consisting of:

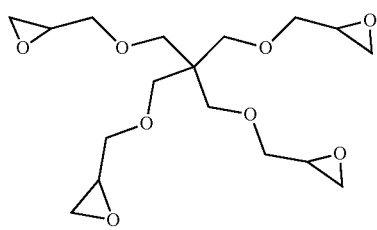

2,2'-(((2,2bis((oxiran-2-ylmethoxy)methyl)propane-1,3-diyl)bis(oxy))bis(methylene))bis(oxirane):

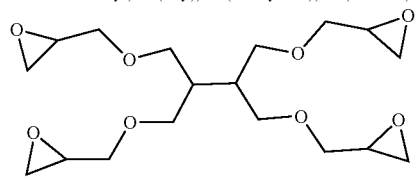

2,2'-(((2-(1,3-bis(oxiran-2-ylmethoxy)propan-2-yl)propane-1,3-diyl)bis(oxy))bis(methylene))bis(oxirane):

-continued

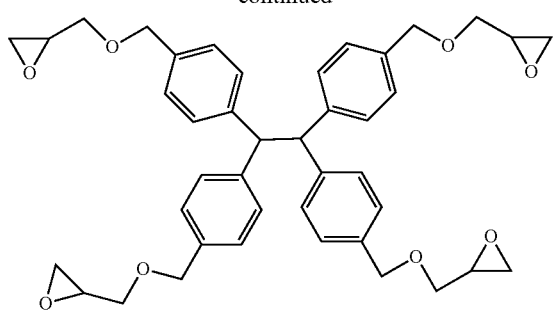

1,1,2,2-tetrakis(4-((oxiran-2-ylmethoxy)methyl)phenyl)ethane:

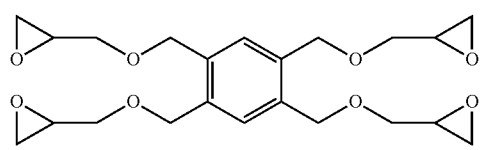

1,2,4,5-tetrakis((oxiran-2-ylmethoxy)methyl)benzene: and

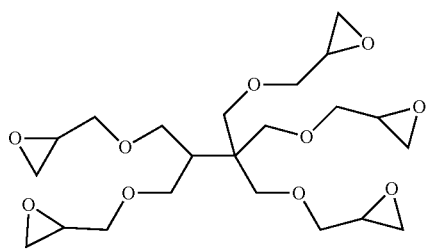

2,2'-(((2-(1,3-bis(oxiran-2-ylmethoxy)propan-2-yl)-2-((oxiran-2-ylmethoxy)methoxy)methyl)propane-1,3-diyl)bis(oxy))bis(methylene))bis(oxirane):

d) a phenolic compound selected from the group consisting of:

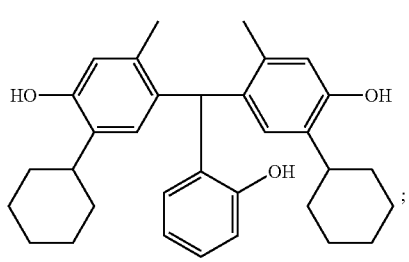

a-1

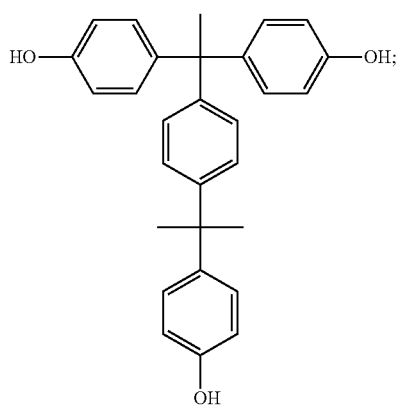

a-2

-continued

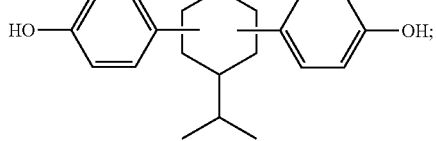

a-3

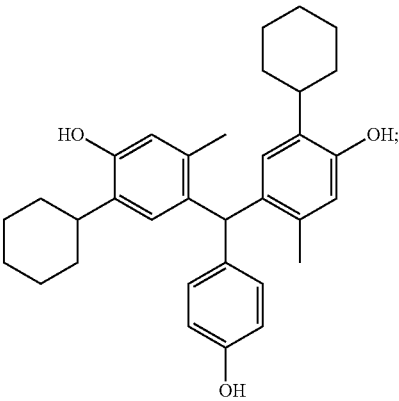

a-4

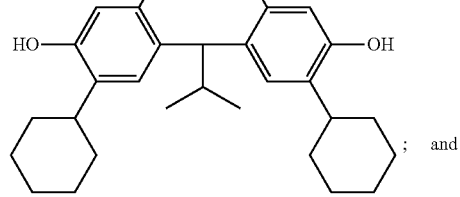

a-5

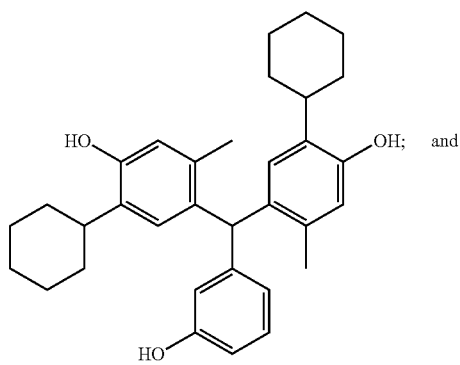

a-6 e) a compound of formula (VI):

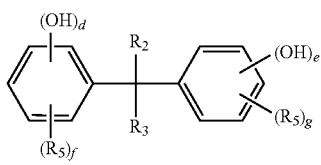

(VI)

wherein d and e are integers from 1 to 4;

f and g are integers from 0 to 4;

$R_2$ and $R_3$ are the same or different and independently of each other selected from hydrogen, methyl, ethyl, linear or branched $C_3$-$C_6$alkyl, $C_3$-$C_8$cycloalkyl, $C_6$-$C_{10}$aryl and $C_7$-$C_{12}$aralkyl; or $R_2$ and $R_3$ taken together with the carbon atom to which they are attached form a 5 to 8 membered substituted or unsubstituted carbocyclic ring where said substituents are selected from $C_1$-$C_8$alkyl; and $R_4$ and $R_5$ are the same or different and independently of each other selected from hydrogen, methyl, ethyl, linear or branched ($C_3$-$C_6$)alkyl, ($C_3$-$C_5$)cycloalkyl, ($C_6$-$C_{10}$)aryl and ($C_7$-$C_{12}$)aralkyl.

2. The photosensitive composition of claim 1 wherein the first repeat unit of the polymer is derived from a monomer selected from the group consisting of:

trioxanonanenorbornene (NBTON);

tetraoxadodecanenorbornene (NBTODD);

5-(3-methoxybutoxy)methyl-2-norbornene (NB-3-MBM); and 5-(3-methoxypropanoxy)methyl-2-norbornene (NB-3-MPM).

3. The photosensitive composition of claim 2 wherein the second repeat unit of the polymer is derived from a monomer selected from the group consisting of:

4-(bicyclo[2.2.1]hept-5-en-2-yl)-1,1,1-trifluoro-2-(trifluoromethyl)butan-2-ol (HFACH$_2$NB);

norbornenyl-2-trifluoromethyl-3,3,3-trifluoropropan-2-ol (HFANB); and 5-(bicyclo[2.2.1]hept-5-en-2-yl)-1,1,1-trifluoro-2-(trifluoromethyl)pentan-2-ol (HFACH$_2$CH$_2$NB).

4. The photosensitive composition of claim 3 wherein the third repeat unit of the polymer is derived from a monomer selected from the group consisting of:

3-(bicyclo[2.2.1]hept-5-en-2-yl)acetic acid (NBMeCOOH);

ethyl 3-(bicyclo[2.2.1]hept-2-en-2-yl)propanoate (EPEsNB);

bicyclo[2.2.1]hept-5-ene-2-carboxylic acid (Acid NB) and norbornenylpropanoic acid (NBEtCOOH).

5. The photosensitive composition of claim 1 wherein the diazo-quinone moiety is represented by formula (C), (D) or (E):

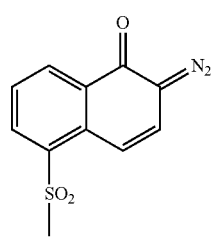
(C)

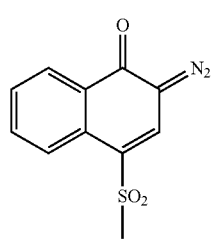
(D)

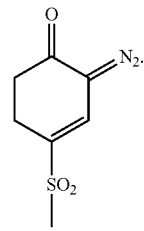
(E)

6. The photosensitive composition of claim 1 wherein the photo active compound is selected from one or more of the following:

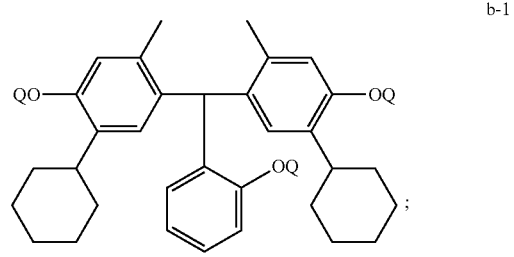
b-1

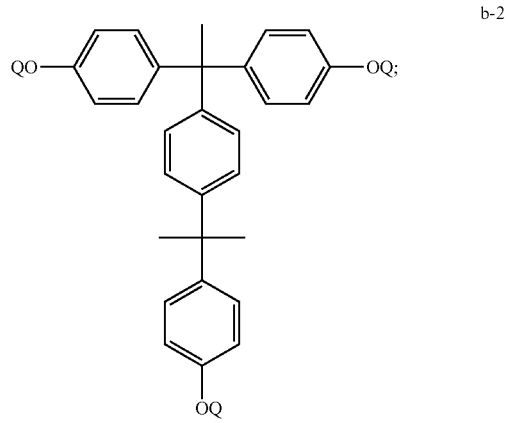
b-2

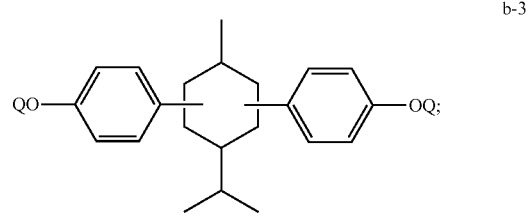
b-3

-continued

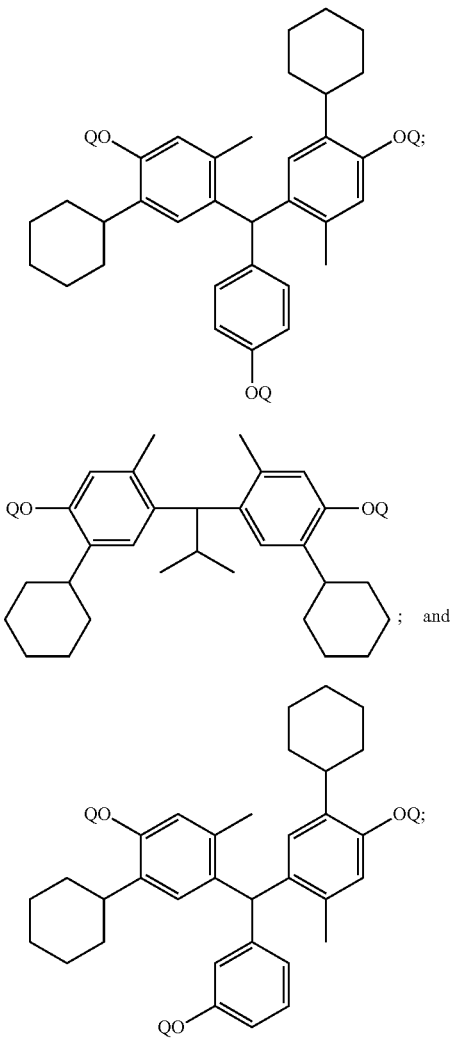

where at least one of Q is a group of the formula (C) or (D):

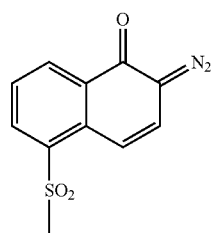

(C)

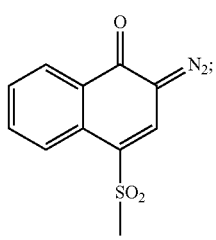

(D)

and
the remaining Q is hydrogen.

7. The photosensitive composition of claim 1 wherein the multifunctional crosslinking agent is selected from the group consisting of:

2,2'-(((2,2-bis((oxiran-1-ylmethoxy)methyl)propane-1,3-diyl)bis(oxy))bis(methylene))bis(oxirane)

2,2'-(((2-(1,3-bis((oxiran-2-ylmethoxy)propan-2-yl)-2-((oxiran-2-ylmethoxy)methyl)propane-1,3-diyl)bis(oxy))bis(methylene))bis(oxirane)

8. The photosensitive composition of claim 1 wherein the compound of formula (VI) is selected from the group consisting of:
2,2'-methylenediphenol;
4,4'-methylenediphenol;
2,2'-(ethane-1,1-diyl)diphenol;
4,4'-(ethane-1,1-diyl)diphenol;
2,2'-(propane-1,1-diyl)diphenol;
4,4'-(propane-1,1-diyl)diphenol;
2,2'-(propane-2,2-diyl)diphenol;
4,4'-(propane-2,2-diyl)diphenol;
2,2'-(4-methylpentane-2,2-diyl)diphenol;
4,4'-(4-methylpentane-2,2-diyl)diphenol;
2,2'-(5-methylheptane-3,3-diyl)diphenol;
4,4'-(5-methylheptane-3,3-diyl)diphenol;
4,4'-(propane-2,2-diyl)bis(2-cyclohexylphenol);
4,4'-(2-methylpropane-1,1-diyl)bis(2-cyclohexyl-5-methylphenol);
5,5"-(cyclohexane-1,1-diyl)bis(([1,1'-biphenyl]-2-01));
4,4'-(cyclohexane-1,1-diyl)bis(2-cyclohexylphenol);
4,4'-(4-methylcyclohexane-1,1-diyl)diphenol;
2-cyclohexyl-4-(2-(4-hydroxyphenyl)propan-2-yl)-5-methylphenol;
6,6'-methylenebis(2-(tert-butyl)-4-methylphenol);
6,6'-(2-methylpropane-1,1-diyl)bis(2,4-dimethylphenol);
4,4'-(2-methylpropane-1,1-diyl)bis(2-(tert-butyl)-5-methylphenol);
and mixtures in any combination thereof.

9. The photosensitive composition of claim 1 wherein the phenolic compound is selected from the group consisting of:

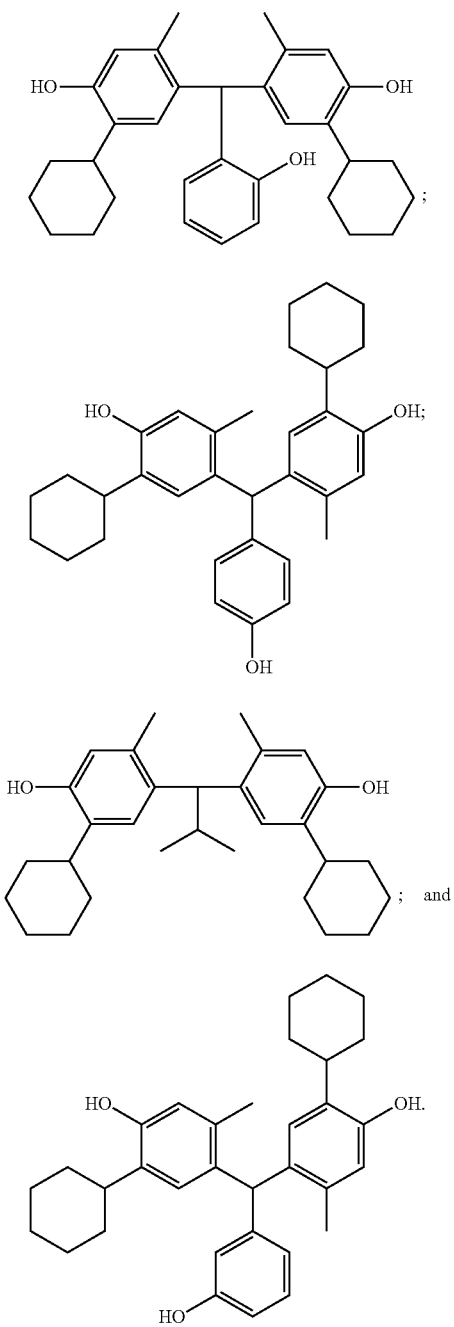

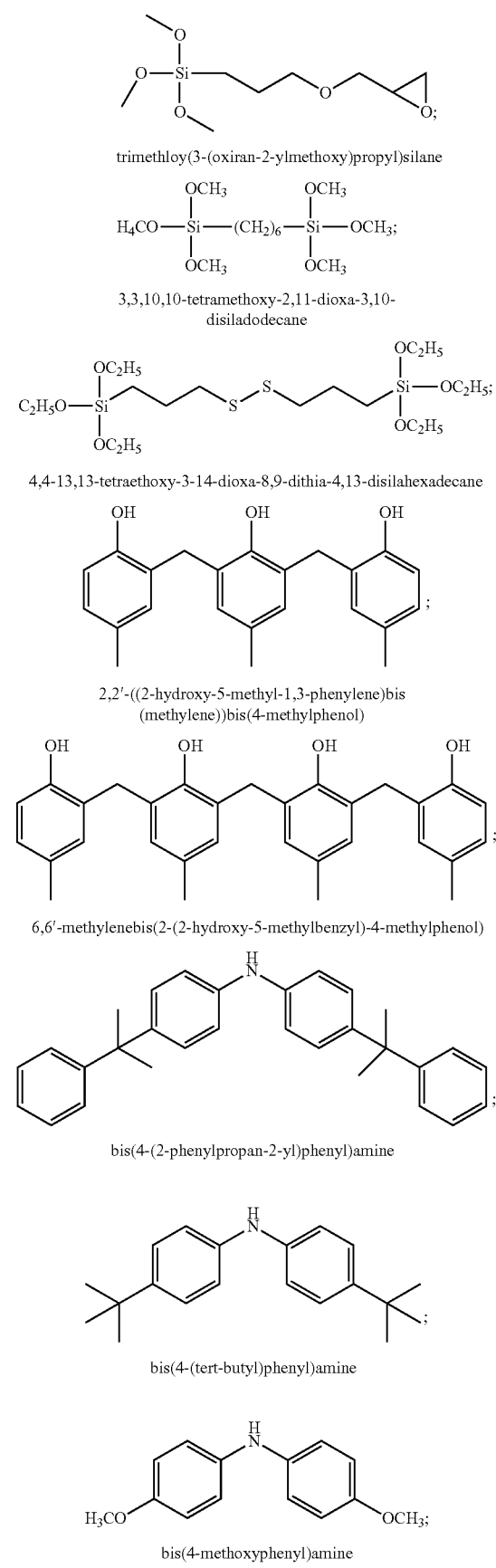

10. The photosensitive composition of claim 1 wherein the compound of formula (VI) is selected from the group consisting of:

2,2'-(4-methylpentane-2,2-diyl)diphenol;
4,4'-(4-methylpentane-2,2-diyl)diphenol;
2,2'-(5-methylheptane-3,3-diyl)diphenol;
4,4'-(5-methylheptane-3,3-diyl)diphenol;
and mixtures in any combination thereof.

11. The photosensitive composition of claim 1 further comprising one or more compounds selected from the group consisting of:

-continued

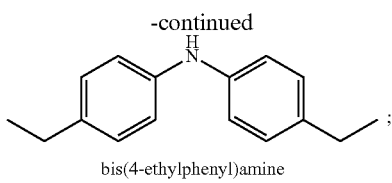
bis(4-ethylphenyl)amine and mixtures in any combination thereof.

12. The photosensitive composition according to claim 1, which is soluble in an alkali developer.

13. A semiconductor or an optoelectronic device comprising a laminated semiconductor element or an adhesive element where said element consists of a photosensitive composition according to claim 1.

14. A semiconductor device comprising a chip stack structure where said chip stack structure further comprises a photosensitive composition according to claim 1.

15. A film comprising the composition of claim 1.

16. A microelectronic or optoelectronic device comprising one or more of a redistribution layer (RDL) structure, a chip-stack structure, a CMOS image sensor dam structure, where said structures further comprise a composition according to claim 1.

17. A method of forming a film for the fabrication of a microelectronic or optoelectronic device comprising:
  coating a suitable substrate with a composition according to claim 1 to form a film;
  patterning the film with a mask by exposing to a suitable radiation;
  developing the film after exposure to form a photo-pattern; and
  curing the film by heating to a suitable temperature.

18. The method of claim 17, where said developing is performed by an aqueous developer.

19. The method of claim 17, where the substrate is first hardbaked before said curing at a temperature of from 120° C. to 160° C. for 20 minutes to 60 minutes.

20. The method of claim 17, where said curing is performed at a temperature of from 150° C. to 200° C. at an incremental heating ramp of 5° C. and for 1 to 5 hours.

* * * * *